(12) United States Patent
Nakajima et al.

(10) Patent No.: US 8,426,112 B2
(45) Date of Patent: Apr. 23, 2013

(54) RESIST UNDERLAYER FILM FORMING COMPOSITION CONTAINING POLYMER HAVING NITROGEN-CONTAINING SILYL GROUP

(75) Inventors: Makoto Nakajima, Toyama (JP); Wataru Shibayama, Toyama (JP); Yuta Kanno, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 297 days.

(21) Appl. No.: 12/676,687

(22) PCT Filed: Sep. 10, 2008

(86) PCT No.: PCT/JP2008/066331
§ 371 (c)(1),
(2), (4) Date: Mar. 5, 2010

(87) PCT Pub. No.: WO2009/034998
PCT Pub. Date: Mar. 19, 2009

(65) Prior Publication Data
US 2010/0304305 A1 Dec. 2, 2010

(30) Foreign Application Priority Data
Sep. 11, 2007 (JP) ................ 2007-235852

(51) Int. Cl.
G03F 7/09 (2006.01)
G03F 7/20 (2006.01)
G03F 7/30 (2006.01)
G03F 7/36 (2006.01)
G03F 7/38 (2006.01)

(52) U.S. Cl.
USPC ........ 430/272.1; 430/311; 430/313; 430/316; 430/317; 430/323; 430/325; 430/326; 430/327; 430/330

(58) Field of Classification Search .................. None
See application file for complete search history.

(56) References Cited

U.S. PATENT DOCUMENTS
2006/0216652 A1  9/2006  Kishioka et al.

FOREIGN PATENT DOCUMENTS

| EP | 1 560 070 A1 | 8/2005 |
|---|---|---|
| EP | 1 703 328 A1 | 9/2006 |
| EP | 1 855 159 A1 | 11/2007 |
| JP | 9-319075 | * 12/1997 |
| JP | A-10-209134 | 8/1998 |
| JP | A-11-258813 | 9/1999 |
| JP | A-2001-93824 | 4/2001 |
| JP | A-2005-70776 | 3/2005 |
| JP | A-2005-115380 | 4/2005 |
| WO | WO 02/086624 A1 | 10/2002 |
| WO | WO 2006/093057 A1 | 9/2006 |

OTHER PUBLICATIONS

Machine-assisted English translation of JP9-319075 as provided by JPO (1997).*
International Search Report issued in International Patent Application No. PCT/JP2008/066331 on Oct. 7, 2008.
Supplementary European Search Report dated Oct. 12, 2010 in corresponding European Application No. 08 831 233.5.

* cited by examiner

*Primary Examiner* — Sin J. Lee
(74) *Attorney, Agent, or Firm* — Oliff & Berridge, PLC

(57) ABSTRACT

There is provided a resist underlayer film for lithography causing no intermixing with a photoresist and having a dry etching rate higher than that of the photoresist, and a resist underlayer film forming composition for forming the underlayer film. A resist underlayer film forming composition for lithography comprising: a polymer containing a partial structure of Formula (1):

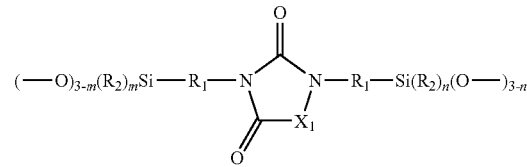

Formula (1)

where $X_1$ is a group of Formula (2), Formula (3), Formula (4) or Formula (4-1):

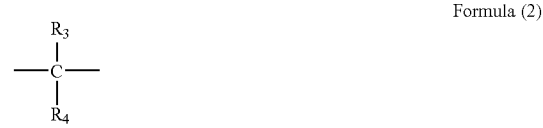

Formula (2)

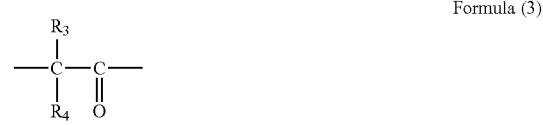

Formula (3)

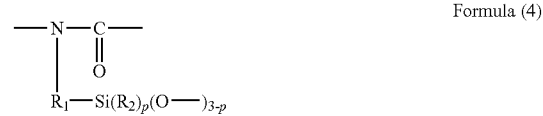

Formula (4)

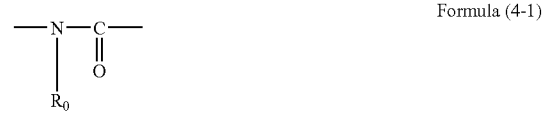

Formula (4-1)

and a solvent. The polymer may contain, besides the partial structure of Formula (1), a partial structure of Formula (5):

$$(R_1)_a(R_3)_b Si(O{-})_{4-(a+b)}$$ Formula (5)

and/or a partial structure of Formula (6):

$$[(R_4)_c Si(O{-})_{3-c}]_2 Y$$ Formula (6).

10 Claims, No Drawings

RESIST UNDERLAYER FILM FORMING COMPOSITION CONTAINING POLYMER HAVING NITROGEN-CONTAINING SILYL GROUP

TECHNICAL FIELD

The present invention relates to a composition for forming an underlayer film between a substrate and a resist (for example, a photoresist and an electron beam resist) that are used in the production of semiconductor devices. More specifically, the present invention relates to a resist underlayer film forming composition for lithography for forming an underlayer film used for an underlayer of a photoresist in a lithography process of the production of semiconductor devices. In addition, the present invention relates to a forming method of a resist pattern using the underlayer film forming composition.

The resist underlayer film forming composition contains a polymer containing a silyl group as a substituent on a nitrogen atom, particularly a polymer represented by a silyl isocyanurate.

BACKGROUND ART

In the production of semiconductor devices, fine processing by lithography using a photoresist has been performed. The fine processing is a processing method for forming fine convexo-concave shapes corresponding to a pattern on the surface of a substrate by: forming a thin film of a photoresist on a semiconductor substrate such as a silicon wafer; irradiating the resultant thin film with an active ray such as an ultraviolet ray through a mask pattern in which a pattern of a semiconductor device is depicted for development; and subjecting the substrate to etching processing using the resultant photoresist pattern as a protecting film. Recently, however, the high integration of semiconductor devices has progressed and the adopted active ray tends to have a shorter wavelength, such as an ArF excimer laser (193 nm) replacing a KrF excimer laser (248 nm). Following such a tendency, the influence of reflection of an active ray on a semiconductor substrate has become a large problem. Thus, in order to solve this problem, widely studied is a method of providing a bottom anti-reflective coating between the photoresist and the substrate. For such a bottom anti-reflective coating, many investigations on an organic bottom anti-reflective coating composed of a polymer having a light absorbing group and the like are performed due to easiness of its use and so on. Examples thereof include: an acrylic resin-based bottom anti-reflective coating having both a hydroxy group as a crosslinkable group and a light absorbing group within one molecule thereof; and a novolac resin-based bottom anti-reflective coating having both a hydroxy group as a crosslinkable group and a light absorbing group within one molecule thereof.

As a characteristic required for the bottom anti-reflective coating, there can be mentioned a large absorbance to light or radiation, no intermixing with a photoresist (being insoluble in a photoresist solvent), no diffusion of low molecule substances from the bottom anti-reflective coating to the photoresist as an upper layer during heating and baking, a higher dry etching rate than that of the photoresist, and the like.

Further, recently, in order to solve a problem of the wiring delay which has become apparent as the miniaturization of a pattern rule of the semiconductor device has progressed, it is studied to use copper as a wiring material. Then, together with it, a dual damascene process is studied as a wiring forming method for the semiconductor substrate. Then, in the dual damascene process, a bottom anti-reflective coating is formed on a substrate having a large aspect ratio in which a via hole is formed. Therefore, for the bottom anti-reflective coating used in this process, filling characteristics capable of filling holes without a void, planarization characteristics capable of forming a planar film on the substrate surface, and the like are required.

In addition, as an underlayer film between the semiconductor substrate and the photoresist, the use of a film known as a hardmask containing a metal element such as silicon and titanium (see, for example Patent Document 1) is performed. In this case, the resist has components largely different those of the hardmask, so that the removal rates of the resist and the hardmask by dry etching largely depend on the type of gas used for dry etching. Then, by appropriately selecting the type of gas, the hardmask can be removed by dry etching without a large decrease in the film thickness of the photoresist. Therefore, when both of the photoresist and the hardmask are used, it is considered that even when the photoresist is a thin film, the protective film (composed of the photoresist and the hardmask) can secure a film thickness satisfactory as a protective film for processing a semiconductor substrate.

Thus, in the production of semiconductor devices in recent years, for achieving various effects such as the reflection preventing effect, a resist underlayer film has become disposed between the semiconductor substrate and the photoresist. Then, also until today, the studies of a composition for a resist underlayer film have been performed, however, due to the diversity of characteristics required for the composition and so on, the development of a novel material for the resist underlayer film is desired.

For example, there is disclosed a composition or a pattern forming method using a compound having a silicon-silicon bond (see, for example Patent Document 2).

In addition, there is disclosed a reflection preventing layer forming composition containing a novolac-shaped silane-containing polymer. This polymer has a novolac group in the backbone and has a cluster-shaped silane in side chains and can contain an acid generator and a crosslinkable compound (see Patent Document 3).

Further, there is also disclosed a hardmask material using a polycarbosilane-containing resin (for example, Patent Document 4 and Patent Document 5).

[Patent Document 1]
Japanese Patent Application Publication No. JP-A-11-258813
[Patent Document 2]
Japanese Patent Application Publication No. JP-A-10-209134
[Patent Document 3]
Japanese Patent Application Publication No. JP-A-2005-115380
[Patent Document 4]
Japanese Patent Application Publication No. JP-A-2001-93824
[Patent Document 5]
Japanese Patent Application Publication No. JP-A-2005-70776

DISCLOSURE OF THE INVENTION

Problems to be Solved by the Invention

It is an object of the present invention to provide a resist underlayer film forming composition for lithography capable of being used in the production of a semiconductor device. More in detail, it is an object of the present invention to provide a resist underlayer film forming composition for lithography for forming a resist underlayer film capable of being used as a hardmask. In addition, it is an object of the present invention to provide a resist underlayer film forming composition for lithography for forming a resist underlayer film capable of being used as a bottom anti-reflective coating. Further, it is an object of the present invention to provide a resist underlayer film for lithography causing no intermixing with a photoresist and having a dry etching rate higher than that of the photoresist, and a resist underlayer film forming composition for forming the underlayer film.

Then, it is another object of the present invention to provide a photoresist pattern forming method using the resist underlayer film forming composition for lithography.

Means for Solving the Problems

The present invention provides: according to a first aspect, a resist underlayer film forming composition for lithography containing a polymer containing a partial structure of Formula (1):

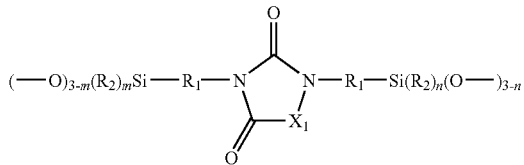

Formula (1)

[where
$X_1$ is a group of Formula (2), Formula (3), Formula (4), or Formula (4-1):

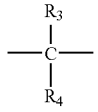

Formula (2)

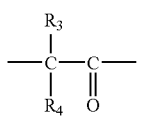

Formula (3)

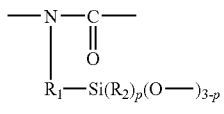

Formula (4)

Formula (4-1)

$R_0$ is a hydrogen atom, an alkyl group, an aryl group, or an alkenyl group,
$R_1$s are independently a divalent organic group,
$R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group, or a cyano group, O— is a group bonded to a silicon atom through a Si—O bond,
$R_3$ and $R_4$ are independently a hydrogen atom, a $C_{1-10}$ alkyl group, a $C_{3-6}$ alkenyl group, a benzyl group or a phenyl group (where, the phenyl group may be substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or
$R_3$ and $R_4$ form together with a carbon atom to which $R_3$ and $R_4$ are bonded, a $C_{3-6}$ ring, and
n, m and p are independently an integer of 0 to 3,
with the proviso that when $X_1$ is a group of Formula (2), Formula (3) or Formula (4-1), $0 \leqq n+m \leqq 5$ is satisfied, and
when $X_1$ is a group of Formula (4), $0 \leqq n+m+p \leqq 8$ is satisfied], and a solvent;
according to a second aspect, the resist underlayer film forming composition according to the first aspect, in which the polymer further contains, besides the partial structure of Formula (1), a partial structure of Formula (5):

Formula (5)

(where
$R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group, or a cyano group,
a and b are independently an integer of 0, 1 or 2,
with the proviso that a+b is an integer of 0, 1 or 2), and/or a partial structure of Formula (6):

Formula (6)

(where
$R_4$ is a $C_{1-10}$ alkyl group,
Y is a $C_{1-6}$ alkylene group, and
c is an integer of 0 or 1);
according to a third aspect, the resist underlayer film forming composition according to the first aspect, in which the polymer further contains, besides the partial structure of Formula (1), the partial structure of Formula (5);
according to a fourth aspect, the resist underlayer film forming composition according to the first aspect, in which the polymer is produced by hydrolyzing and condensing an organic silicon compound of Formula (1'):

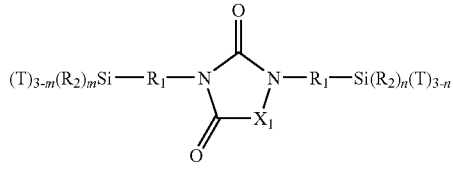

Formula (1')

(where
$X_1$ is a group of Formula (2'), Formula (3'), Formula (4'), or Formula (4'-1):

Formula (2')

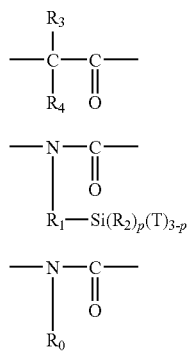

Formula (3')

Formula (4')

Formula (4'-1)

$R_0$ is a hydrogen atom, an alkyl group, an aryl group, or an alkenyl group, $R_1$s are independently a divalent organic group, $R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group, or a cyano group, O— is a group bonded to a silicon atom through a Si—O bond, $R_3$ and $R_4$ are independently a hydrogen atom, a $C_{1-10}$ alkyl group, a $C_{3-6}$ alkenyl group, a benzyl group or a phenyl group (where, the phenyl group may be substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or $R_3$ and $R_4$ form together with a carbon atom to which $R_3$ and $R_4$ are bonded, a $C_{3-6}$ ring, T is a $C_{1-10}$ alkoxy group, an acyloxy group or a halogen group, and n and m are independently an integer of 0 to 3, with the proviso that when $X_1$ is a group of Formula (2'), Formula (3') or Formula (4'-1), $0 \leq n+m \leq 5$ is satisfied, and when $X_1$ is a group of Formula (4'), $0 \leq n+m+p \leq 8$ is satisfied);

according to a fifth aspect, the resist underlayer film forming composition according to the second aspect, in which the polymer is produced by hydrolyzing and condensing an organic silicon compound of Formula (1') and an organic silicon compound of Formula (5'):

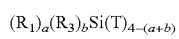 Formula (5')

(where $R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group, or a cyano group, T is a $C_{1-10}$ alkoxy group, an acyloxy group or a halogen group, and a and b are independently an integer of 0, 1 or 2, with the proviso that a+b is an integer of 0, 1 or 2), and/or an organic silicon compound of Formula (6'):

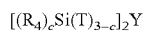 Formula (6')

(where $R_4$ is a $C_{1-10}$ alkyl group,

Y is a $C_{1-6}$ alkylene group,

T is a $C_{1-10}$ alkoxy group, an acyloxy group or a halogen group, and c is an integer of 0 or 1);

according to a sixth aspect, the resist underlayer film forming composition according to the third aspect, in which the polymer is produced by hydrolyzing and condensing an organic silicon compound of Formula (1') and an organic silicon compound of Formula (5');

according to a seventh aspect, the resist underlayer film forming composition according to any one of the first aspect to the sixth aspect, further containing a crosslinking catalyst;

according to an eighth aspect, a resist underlayer film obtained by applying the resist underlayer film forming composition as described in any one of the first aspect to the seventh aspect on a semiconductor substrate and by baking the resist underlayer film forming composition;

according to a ninth aspect, a production method of a semiconductor device including: applying the resist underlayer film forming composition as described in any one of the first aspect to the seventh aspect on a semiconductor substrate and baking the resist underlayer film forming composition to form a resist underlayer film; applying a composition for a resist on the underlayer film to form a resist film; subjecting the resist film to exposure; developing the resist after the exposure to produce a resist pattern; etching the resist underlayer film using the resist pattern; and processing the semiconductor substrate using the patterned resist and the patterned resist underlayer film; and according to a tenth aspect, a production method of a semiconductor device including: forming an organic film on a semiconductor substrate using an application-type organic film forming composition; applying the resist underlayer film forming composition as described in any one of the first aspect to the seventh aspect on the organic film and baking the resist underlayer film forming composition to fowl a resist underlayer film; applying a composition for a resist on the resist underlayer film to form a resist film; subjecting the resist film to exposure; developing the resist after the exposure to produce a resist pattern; etching the resist underlayer film using the resist pattern; etching the organic underlayer film using the patterned resist underlayer film; and processing the semiconductor substrate using the patterned organic film.

Effects of the Invention

In the present invention, the resist underlayer film is formed by an applying method either on a substrate or on an organic underlayer film formed on a substrate and on the resist underlayer film, a resist film (for example, a photoresist or an electron beam resist) is formed. Then, a resist pattern is formed by exposure and development, and either by dry etching the resist underlayer film using the resist pattern to transfer the pattern, the substrate is processed by the transferred pattern, or by etching the organic underlayer film to transfer the pattern, the substrate is processed by the etched organic underlayer film.

In forming a fine pattern, for preventing a pattern collapse, the resist film thickness tends to become smaller. Due to the thinning of the resist, the dry etching for transferring the pattern to a film existing as an underlayer of the resist cannot transfer the pattern unless the etching rate of the underlayer film is higher than that of the upper layer film. In the present invention, the substrate is coated with the resist underlayer film (containing an inorganic silicon-based compound) of the present invention either with or without an organic underlayer film interposed therebetween and then the resist underlayer film is coated with a resist film (an organic resist film). An organic component film and an inorganic component film have dry etching rates largely different from each other depending on the selection of the etching gas such that the dry etching rate of the organic component film is enhanced by an oxygen-based gas and the dry etching rate of the inorganic component film is enhanced by a halogen-containing gas.

For example, there is formed a resist pattern which is transferred to the resist underlayer film of the present invention existing as the underlayer of the resist pattern by dry etching the resist underlayer film with a halogen-containing gas, and the substrate is processed with a halogen-containing gas according to the pattern transferred to the resist underlayer film. In addition, by dry etching the organic underlayer film existing as the underlayer of the resist underlayer film to which the pattern is transferred with an oxygen-based gas using the resist underlayer film, the pattern is transferred to the organic underlayer film, and the substrate is processed with a halogen-containing gas using the organic underlayer film to which the pattern is transferred.

In the present invention, the resist underlayer film functions as a hardmask and a polymer containing a partial structure of Formula (1) has a nitrogen-containing heterocycle structure such as a pyrimidine trione structure, an imidazolidine dione structure and a triazine trione structure, and a silyl structure as a substituent on a nitrogen atom of the nitrogen-containing heterocycle structure. In the nitrogen-containing heterocycle structure, a carbon-nitrogen bond and a carbon-oxygen bond have a dry etching rate higher than that of a carbon-carbon bond, so that these bonds are effective when an upper layer resist pattern is transferred to the resist pattern of the resist underlayer film. In addition, the silyl structure as a substituent on a nitrogen atom of a nitrogen-containing heterocycle structure is effective as a hardmask for etching the organic underlayer film existing as an underlayer of the resist underlayer film or for processing (etching) the substrate. In other words, the silyl structure has a satisfactory dry etching resistance during the processing of the substrate or relative to a dry etching gas for the organic underlayer film.

The resist underlayer film is provided with the enhancement of the dry etching rate relative to the upper layer resist and the dry etching resistance during the processing of the substrate.

BEST MODES FOR CARRYING OUT THE INVENTION

The resist underlayer film forming composition of the present invention contains a polymer containing a partial structure of Formula (1) or a polymer containing a partial structure of Formula (1) and a partial structure of Formula (5) and/or Formula (6), and a solvent. The resist underlayer film forming composition of the present invention may contain as optional components, a crosslinking catalyst, an acid generator, other organic polymers, an absorptive compound, a surfactant and the like.

The solid content in the resist underlayer film forming composition of the present invention is, for example 0.5 to 50% by mass, or 1 to 30% by mass, 5 to 25% by mass. Here, the solid content is a component remaining after subtracting a solvent component from all components of the resist underlayer film forming composition.

The content constituted by the polymer in the solid content is 20% by mass or more, for example 50 to 100% by mass, 60 to 95% by mass, 70 to 90% by mass.

The present invention is a resist underlayer film forming composition for lithography containing a polymer containing a partial structure of Formula (1) and a solvent. Here, $X_1$ in Formula (1) is a group of Formula (2), Formula (3), Formula (4) or Formula (4-1). $R_0$ is a hydrogen atom, an alkyl group, an aryl group, or an alkenyl group. $R_1$s are independently a divalent organic group. Examples of the divalent organic group include a $C_{1-6}$ alkylene group, a hydroxy alkylene group, an ester group-containing organic group, an ether group-containing organic group, and a sulfide group-containing organic group. $R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group. O— is a group bonded to a silicon atom through a Si—O bond. $R_3$ and $R_4$ are independently a hydrogen atom, a $C_{1-10}$ alkyl group, a $C_{3-6}$ alkenyl group, a benzyl group or a phenyl group (where, the phenyl group may be substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or $R_3$ and $R_4$ form together with a carbon atom to which they are bonded, a $C_{3-6}$ ring. n and m are independently an integer of 0 to 3, with the proviso that when $X_1$ is a group of Formula (2), Formula (3) or Formula (4-1), n and m satisfy the equation: $0 \leq n+m \leq 5$, and when $X_1$ is a group of Formula (4), n, m and p satisfy the equation: $0 \leq n+m+p \leq 8$.

Examples of the $C_{1-6}$ alkylene group include a methylene group, an ethylene group, a propylene group, a butylene group, a pentylene group, and a hexylene group, and include also hydroxyalkylene groups produced by substituting the above alkylene groups with a hydroxy group. In addition, examples of the ester group-containing organic group include organic groups obtained by a reaction of a carboxylic acid with a hydroxy group; examples of the ether group-containing organic group include organic groups obtained by a reaction of a hydroxy group with an allyl group; and examples of the sulfide group-containing organic group include organic groups obtained by a reaction of a sulfide group with an allyl group.

$R_2$ is an organic group bonded to a silicon atom. The organic group has an alkyl group, an aryl group, a halogenated alkyl group, a halogenated aryl group, an alkenyl group, an epoxy group, an acryloyl group, a methacryloyl group, a mercapto group, an amino group, or a cyano group.

Examples of the alkyl group include cyclic or chained alkyl groups.

Examples of a $C_{1-10}$ cyclic alkyl group include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Examples of the $C_{1-10}$ chained alkyl group include linear alkyl groups and branched alkyl groups, for example, a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

Examples thereof include organic groups in which the above groups are substituted with a halogen atom such as fluorine, chlorine, bromine, and iodine.

Examples of the aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group and a 9-phenanthryl group.

Examples of the $C_{2-10}$ alkenyl group include an ethenyl (vinyl) group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl-ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl-ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl-ethenyl group, a 1,2-dimethyl-1-propenyl group, a 1,2-dimethyl-2-propenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl-ethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dipentenylmethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl-ethenyl group, a 1,3-dimethyl-1-butenyl group, a 1,3-dimethyl-2-butenyl group, a 1,3-dimethyl-3-butenyl group, a 1-isobutyl-ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-cert-butyl-ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group and a 1-isopropyl-2-propenyl group.

In addition, —O in the silyl structure is a group bonded to a silicon atom through a Si—O bond.

In $R_3$ and $R_4$, examples of the alkyl group and of the alkenyl group include the above examples.

Examples of the alkoxy group include a methoxy group, an ethoxy group, an n-propoxy group, an isopropoxy group, an n-butoxy group, an isobutoxy group, a sec-butoxy group, a tert-butoxy group, an n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group and a 1-ethyl-2-methyl-n-propoxy group.

Examples of the alkylthio group include an ethylthio group, a butylthio group, a hexylthio group, and an octylthio group.

The polymer used in the present invention can be produced by a method of hydrolyzing and condensing an organic silicon compound of Formula (1').

In addition, the polymer can be produced by a method of hydrolyzing and condensing an organic silicon compound of Formula (1') and an organic silicon compound of Formula (5') and/or Formula (6').

Then, the polymer can be produced by a method of hydrolyzing and condensing an organic silicon compound of Formula (1') and an organic silicon compound of Formula (5').

Further, the polymer can be produced also by a method of reacting a polymer produced by hydrolyzing and condensing an organic silicon compound of Formula (5') and/or Formula (6') with an organic silicon compound of Formula (1').

As the organic silicon compound of Formula (1'), a commercially available product can be used.

In addition, the organic silicon compound of Formula (1') can be obtained by reacting a compound having a silyl structure as a substituent on a nitrogen atom of a compound having a nitrogen-containing heterocycle structure such as a pyrimidine trione structure, an imidazolidine dione structure and a triazine trione structure. The organic silicon compound can be produced also by reacting a hydrogen atom on a nitrogen atom in the above structure with an alkoxyhalosilane compound.

In addition, the organic silicon compound of Formula (1') can be produced by reacting a compound having a pyrimidine trione structure, an imidazolidine dione structure or a triazine trione structure having an epoxy group with an alkoxyhydrosilane or an alkoxyhalosilane.

As one example, the organic silicon compound of Formula (1') can be produced by subjecting tris-(2,3-epoxypropyl)-isocyanurate to an addition reaction with an alkoxyhydrosilane.

In Formula (1'), n, m and p are independently an integer of 0 to 3, with the proviso that when $X_1$ is a group of Formula (2'), Formula (3') or Formula (4'-1), n and m satisfy the equation: $0 \leq n+m \leq 5$, and when $X_1$ is a group of Formula (4'), n, m and p satisfy the equation: $0 \leq n+m+p \leq 8$. In other words, in Formula (1'), there exists at least one Si—O— bond and the Si—O— bond can exist in a number up to the maximum number that Si can have. When one Si—O— bond exists in Formula (1'), the Si—O— bond becomes a partial structure bonded to a polymer obtained by hydrolyzing and condensing an organic silicon compound of Formula (5') and/or Formula (6') which is described below. In addition, when two or more Si—O— bonds exist in Formula (1'), a polymer containing a partial structure of Formula (1') as a repeating unit can be formed, an organic silicon compound of Formula (1') and an organic silicon compound of Formula (5') and/or Formula (6') can be copolymerized (co-condensed), and the Si—O— bond can be a partial structure bonded to a polymer obtained by hydrolyzing and condensing an organic silicon compound of Formula (1') and an organic silicon compound of Formula (5') and/or Formula (6').

When the organic silicon compound of Formula (1') is copolymerized (co-condensed) with an organic silicon compound, any one of or both of the organic silicon compound of Formula (5') and the organic silicon compound of Formula (6') can be used. However, it is preferred that the organic silicon compound of Formula (1') and the organic silicon compound of Formula (5') are copolymerized (co-condensed).

In the organic silicon compound of Formula (5'), $R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group; and a and b are independently an integer of 0, 1 or 2, with the proviso that a+b is an integer of 0, 1 or 2. Examples of these organic groups include the above-described examples.

In the organic silicon compound of Formula (6'), $R_4$ is a $C_{1-10}$ alkyl group; Y is a $C_{1-6}$ alkylene group; and c is an integer of 0 or 1. Examples of these organic groups include the above-described examples.

In the organic silicon compound of Formula (1'), the organic silicon compound of Formula (5') and the organic silicon compound of Formula (6'), a structure formed by hydrolyzing an alkoxysilyl group, an acyloxysilyl group or a halogenated silyl group (the above Si-T) is the partial structure of Formula (1), the partial structure of Formula (5) or the partial structure of Formula (6), respectively. Accordingly, the partial structure of Formula (1), the partial structure of Formula (5) and the partial structure of Formula (6) correspond to the organic silicon compound of Formula (1'), the organic silicon compound of Formula (5') and the organic silicon compound of Formula (6'), respectively. T in the Si-T is a $C_{1-10}$ alkoxy group, an acyloxy group or a halogen group.

In T, examples of the $C_{1-10}$ alkoxy group include alkoxy groups having a $C_{1-10}$ linear, branched or cyclic alkyl portion. Examples of the linear or branched alkoxy group include a methoxy group, an ethoxy group, an n-propoxy group, an isopropoxy group, an n-butoxy group, an isobutoxy group, a sec-butoxy group, a tert-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group and a 1-ethyl-2-methyl-n-propoxy group. Examples of the cyclic alkoxy group include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-isopropyl-cyclopropoxy group, a 2-isopropyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group and a 2-ethyl-3-methyl-cyclopropoxy group.

In T, examples of the $C_{1-10}$ acyloxy group include a methylcarbonyloxy group, an ethylcarbonyloxy group, an n-propylcarbonyloxy group, an isopropylcarbonyloxy group, an n-butylcarbonyloxy group, an isobutylcarbonyloxy group, a sec-butylcarbonyloxy group, a tert-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butyl carbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group and a tosylcarbonyloxy group.

Examples of the halogen group of T include fluorine, chlorine, bromine and iodine.

By hydrolyzing the organic silicon compound of Formula (1'), the organic silicon compound of Formula (5') and the organic silicon compound of Formula (6'), a condensate having a weight average molecular weight of 1,000 to 1,000,000 or 1,000 to 100,000 can be obtained.

For hydrolyzing the alkoxysilyl group, the acyloxysilyl group or the halogenated silyl group, there is used 1 to 100 mol, preferably 1 to 50 mol of water per 1 mol of a hydrolysable group.

The reaction temperature for performing the hydrolysis and the condensation is usually 20 to 80° C.

During the hydrolysis and the condensation, a catalyst can be used.

Examples of the catalyst include metal chelate compounds, organic acids, inorganic acids, organic bases and inorganic bases. Examples of the metal chelate compound include: titanium chelate compounds such as triethoxy-mono(acetylacetonate)titanium, tri-n-propoxy-mono(acetylacetonate)titanium, triisopropoxy-mono(acetylacetonate)titanium, tri-n-butoxy-mono(acetylacetonate)titanium, tri-sec-butoxy-mono(acetylacetonate)titanium, tri-tert-butoxy-mono(acetylacetonate)titanium, diethoxy-bis(acetylacetonate)titanium, di-n-propoxy-bis(acetylacetonate)titanium, diisopropoxy-bis(acetylacetonate)titanium, di-n-butoxy-bis(acetylacetonate)titanium, di-sec-butoxy-bis(acetylacetonate)titanium, di-tert-butoxy-bis(acetylacetonate)titanium, monoethoxy-tris(acetylacetonate)titanium, mono-n-propoxy-tris(acetylacetonate)titanium, monoisopropoxy-tris(acetylacetonate)titanium, mono-n-butoxy-tris(acetylacetonate)titanium, mono-sec-butoxy-tris(acetylacetonate)titanium, mono-tert-butoxy-tris(acetylacetonate)titanium, tetrakis(acetylacetonate)titanium, triethoxy-mono(ethylacetoacetate)titanium, tri-n-propoxy-mono(ethylacetoacetate)titanium, triisopropoxy-mono(ethylacetoacetate)titanium, tri-n-butoxy-mono(ethylacetoacetate)titanium, tri-sec-butoxy-mono(ethylacetoacetate)titanium, tri-tert-butoxy-mono(ethylacetoacetate)titanium, diethoxy-bis(ethylacetoacetate)titanium, di-n-propoxy-bis(ethylacetoacetate)titanium, diisopropoxy-bis(ethylacetoacetate)titanium, di-n-butoxy-bis(ethylacetoacetate)titanium, di-sec-butoxy-bis(ethylacetoacetate)titanium, di-tert-butoxy-bis(ethylacetoacetate)titanium, monoethoxy-tris(ethylacetoacetate)titanium, mono-n-propoxy-tris(ethylacetoacetate)titanium, monoisopropoxy-tris(ethylacetoacetate)titanium, mono-n-butoxy-tris(ethylacetoacetate)titanium, mono-sec-butoxy-tris(ethylacetoacetate)titanium, mono-tert-butoxy-tris(ethylacetoacetate)titanium, tetrakis(ethylacetoacetate)titanium, mono(acetylacetonate)tris(ethylacetoacetate)titanium, bis(acetylacetonate)bis(ethylacetoacetate)titanium and tris(acetylacetonate)mono(ethylacetoacetate)titanium; zirconium chelate compounds such as triethoxy-mono(acetylacetonate)zirconium, tri-n-propoxy-mono(acetylacetonate)zirconium, triisopropoxy-mono(acetylacetonate)zirconium, tri-n-butoxy-mono(acetylacetonate)zirconium, tri-sec-butoxy-mono(acetylacetonate)zirconium, tri-tert-butoxy-mono(acetylacetonate)zirconium, diethoxy-bis(acetylacetonate)zirconium, di-n-propoxy-bis(acetylacetonate)zirconium, diisopropoxy-bis(acetylacetonate)zirconium, di-n-butoxy-bis(acetylacetonate)zirconium, di-sec-butoxy-bis(acetylacetonate)zirconium, di-tert-butoxy-bis(acetylacetonate)zirconium, monoethoxy-tris(acetylacetonate)zirconium, mono-n-propoxy-tris(acetylacetonate)zirconium, monoisopropoxy-tris(acetylacetonate)zirconium, mono-n-butoxy-tris(acetylacetonate)zirconium, mono-sec-butoxy-tris(acetylacetonate)zirconium, mono-tert-butoxy-tris(acetylacetonate)zirconium, tetrakis(acetylacetonate)zirconium, triethoxy-mono(ethylacetoacetate)zirconium, tri-n-propoxy-mono(ethylacetoacetate)zirconium, triisopropoxy-mono(ethylacetoacetate)zirconium, tri-n-butoxy-mono(ethylacetoacetate)zirconium, tri-sec-butoxy-mono(ethylacetoacetate)zirconium, tri-tert-butoxy-mono(ethylacetoacetate)zirconium, diethoxy-bis(ethylacetoacetate)zirconium, di-n-propoxy-bis(ethylacetoacetate)zirconium, diisopropoxy-bis(ethylacetoacetate)zirconium, di-n-butoxy-bis(ethylacetoacetate)zirconium, di-sec-butoxy-bis(ethylacetoacetate)zirconium, di-tert-butoxy-bis(ethylacetoacetate)zirconium, monoethoxy-tris(ethylacetoacetate)zirconium, mono-n-propoxy-tris(ethylacetoacetate)zirconium, monoisopropoxy-tris(ethylacetoacetate)zirconium, mono-n-butoxy-tris(ethylacetoacetate)zirconium, mono-sec-butoxy-tris(ethylacetoacetate)zirconium, mono-tert-butoxy-tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium and tris(acetylacetonate)mono(ethylacetoacetate)zirconium; and aluminum chelate compounds such as tris(acetylacetonate)aluminum and tris(ethylacetoacetate)aluminum.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid and tartaric acid. Examples of the inorganic acid include hydrochloric acid, nitric acid, sulfuric acid, hydrofluoric acid and phosphoric acid.

Examples of the organic base include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo-octane, diazabicyclo-nonane, diazabicyclo-undecene and tetramethylammoniumhydroxide.

Examples of the inorganic base include ammonia, sodium hydroxide, potassium hydroxide, barium hydroxide and calcium hydroxide.

Among these catalysts, metal chelate compounds, organic acids and inorganic acids are preferred and these catalysts may be used individually or in combination of two or more types thereof.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide and N-methylpyrrolidone; and sulfur-containing solvents such as dimethyl sulfide, diethyl sulfide, thiophene, tetrahydrothiophene, dimethylsulfoxide, sulfolan and 1,3-propane sultone.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate and propylene glycol monopropyl ether acetate are preferred in terms of the preservation stability of the solution thereof.

In the case of a polymer containing the partial structure of Formula (1) and the partial structure of Formula (5) and/or Formula (6), when the molar ratio of the partial structure of Formula (1) is denoted as A and the molar ratio of the partial structure of Formula (5) and/or Formula (6) is denoted as B, A:B is 1:0 to 50, preferably 1:0 to 20.

In addition, when the molar ratio of the partial structure of Formula (5) is denoted as B1 and the molar ratio of the partial structure of Formula (6) is denoted as B2, B1:B2 is 1:0 to 2, preferably 1:0 to 1.

Examples of the organic silicon compound of Formula (1') used for producing the polymer used in the present invention include compounds of the following Formulae:

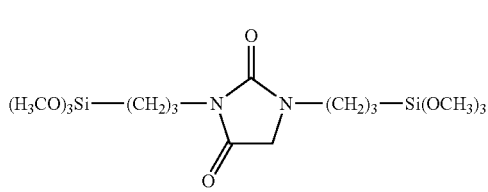 (1-1)

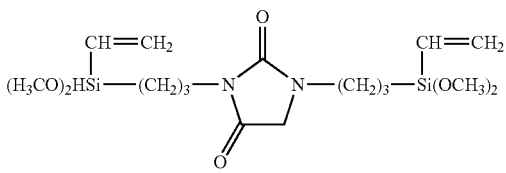 (1-2)

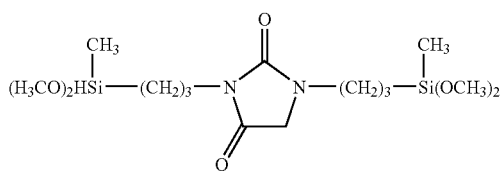 (1-3)

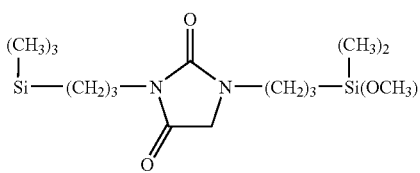 (1-4)

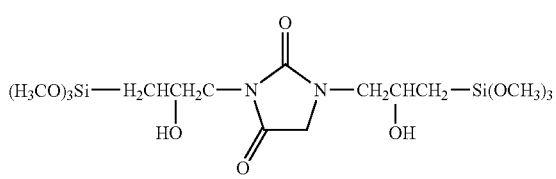 (1-5)

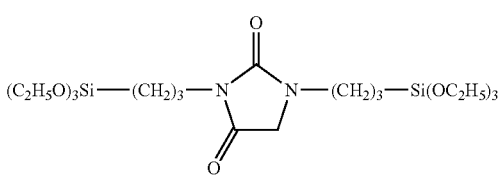 (1-6)

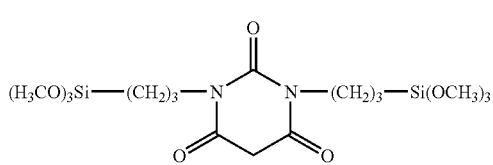 (1-7)

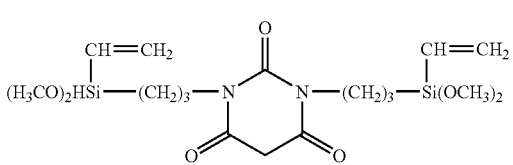 (1-8)

-continued
(1-9)
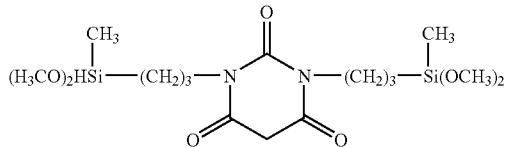
(1-10)
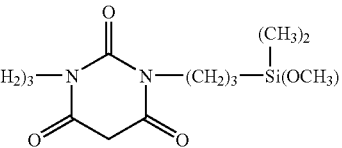
(1-11)
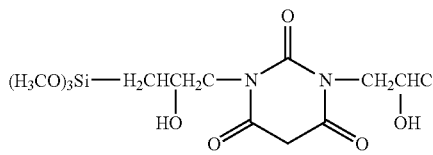
(1-12)
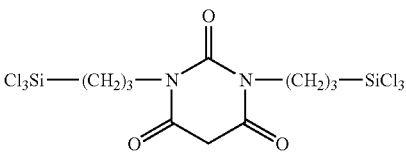
(1-13)
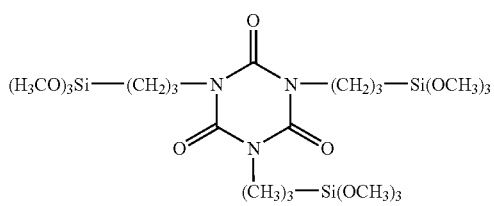
(1-14)
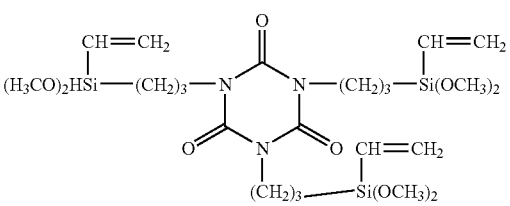
(1-15)
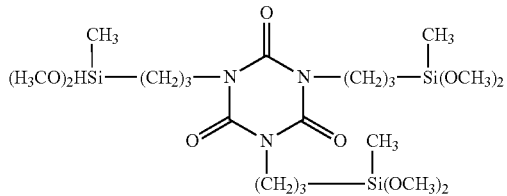
(1-16)
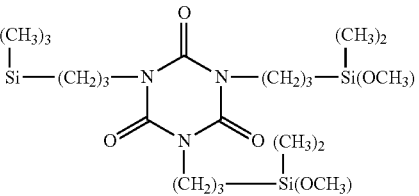
(1-17)
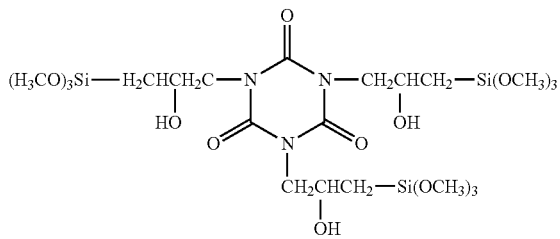
(1-18)
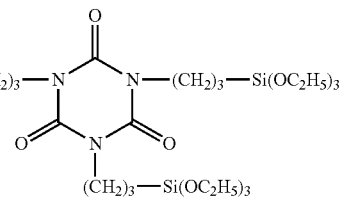
(1-19)
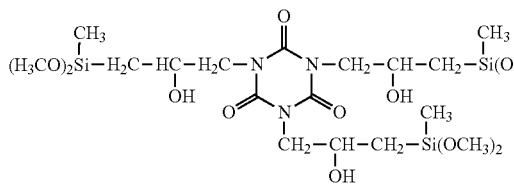
(1-20)
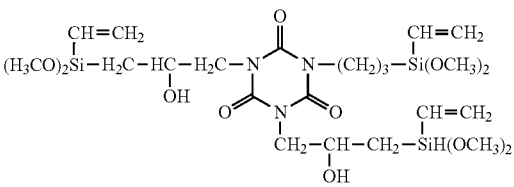
(1-21)
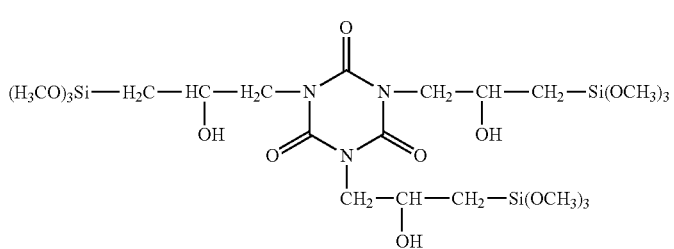

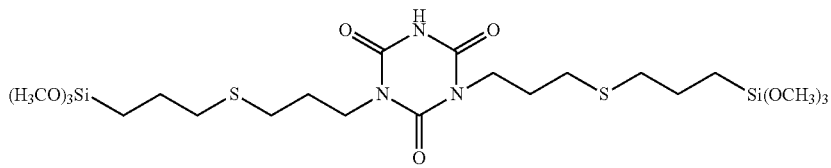

(1-22)

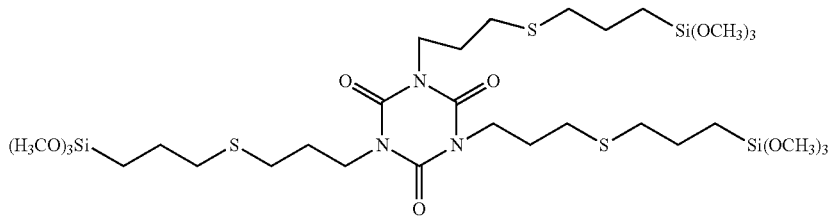

(1-23)

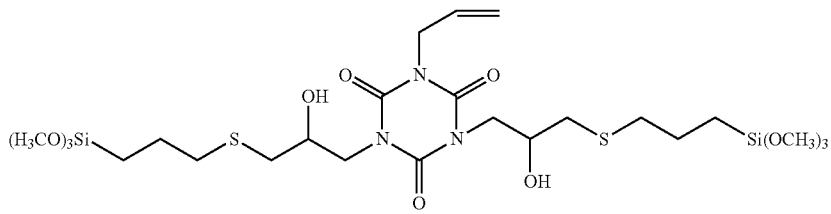

(1-24)

Examples of the organic silicon compound of Formula (5') used for producing the polymer used in the present invention include tetramethoxysilane, tetraethoxysilane, tetra-n-propoxysilane, tetraisopropoxysilane, tetra-n-butoxysilane, tetraacetoxysilane, methyltrimethoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxypropyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldiethoxysilane, glycidoxyethylmethyldimethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysitane, γ-glycidoxypropylvinyldiethoxysilane, ethyltrimethoxysilane, ethyltriethoxysilane, vinyltrimethoxysilane, vinyltriethoxysilane, vinyltriacetoxysilane, phenyltrimethoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, N-(β-aminoethyl)γ-aminopropyltrimethoxysilane, N-(β-aminoethyl)γ-aminopropylmethyldimethoxysilane, γ-aminopropylmethyldimethoxysilane, N-(β-aminoethyl)γ-aminopropyltriethoxysilane, N-(β-aminoethyl)γ-aminopropylmethyldiethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane and methylvinyldiethoxysilane. These organic silicon compounds may be used individually or in combination of two or more types thereof.

Particularly preferred are tetramethoxysilane, tetraethoxysilane and tetra-n-propoxysilane.

Examples of the organic silicon compound of Formula (6') used for producing the polymer used in the present invention include methylenebismethyldimethoxysilane, ethylenebisethyldimethoxysilane, propylenebisethyldiethoxysilane and butylenebismethyldiethoxysilane, and these organic silicon compounds may be used individually or in combination of two or more types thereof.
Examples of the partial structure of the polymer used in the present invention include partial structures of the following Formulae:
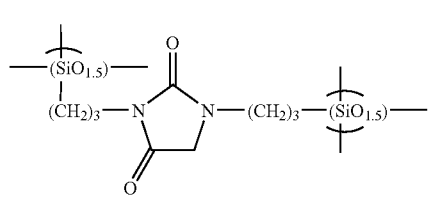
(2-1)
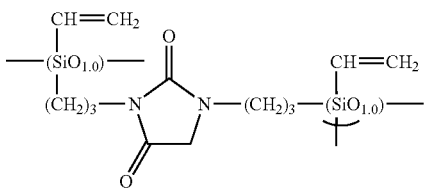
(2-2)
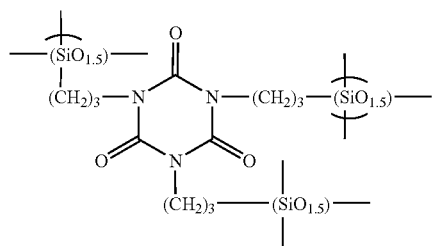
(2-3)
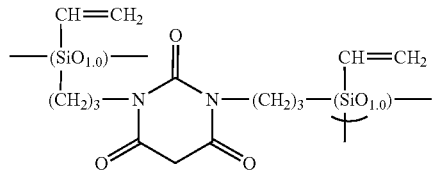
(2-4)
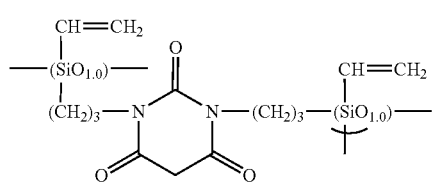
(2-5)
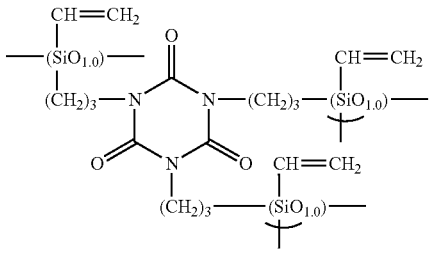
(2-6)
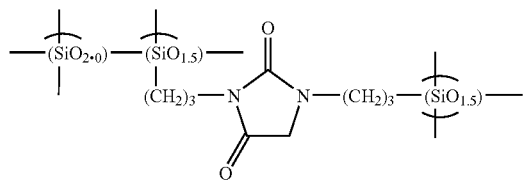
(2-7)
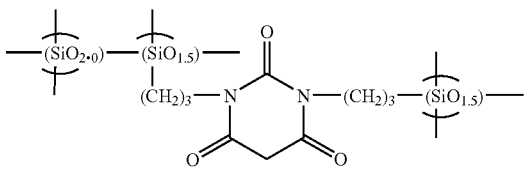
(2-8)
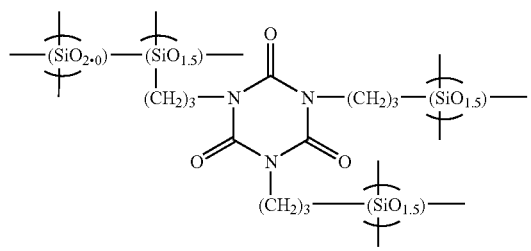
(2-9)
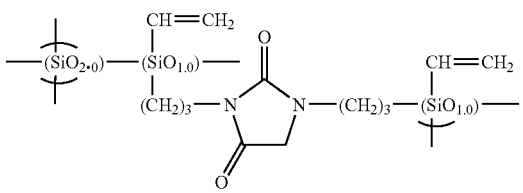
(2-10)
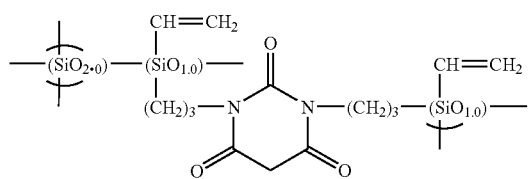
(2-11)
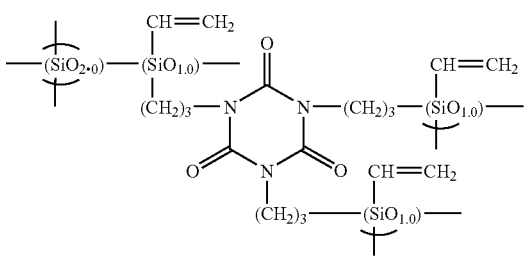
(2-12)

-continued
(2-13) 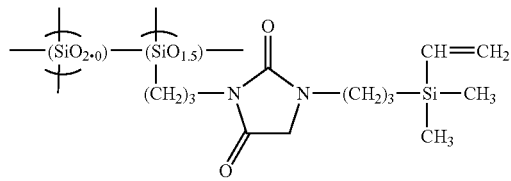
(2-14) 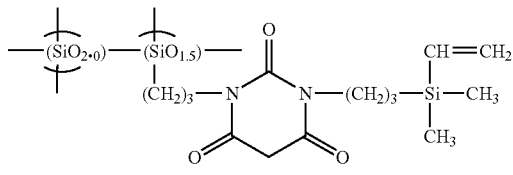
(2-15) 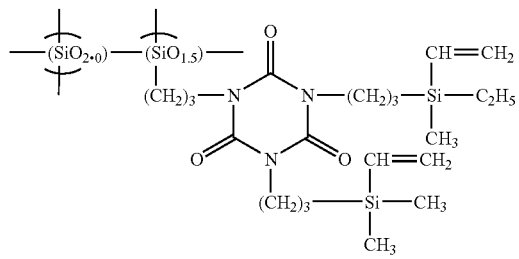
(2-16) 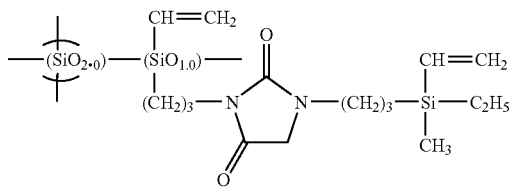
(2-17) 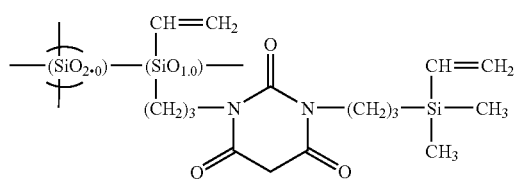
(2-18) 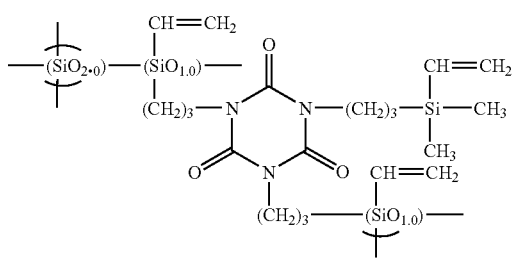
(2-19) 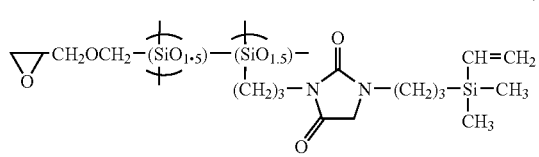
(2-20) 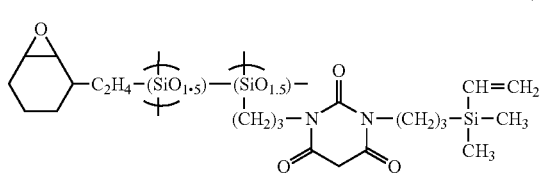
(2-21) 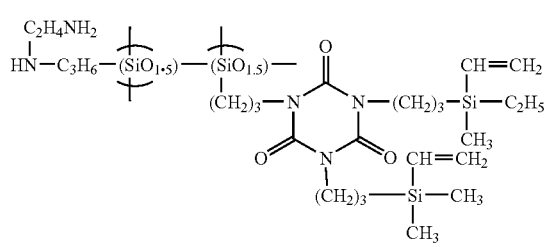
(2-22) 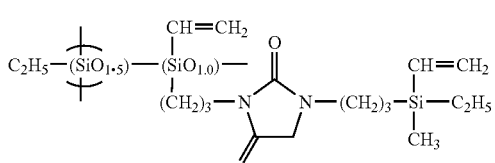
(2-23) 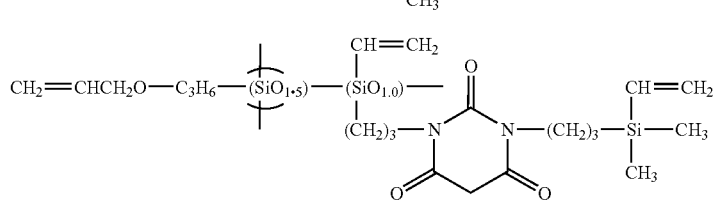
(2-24) 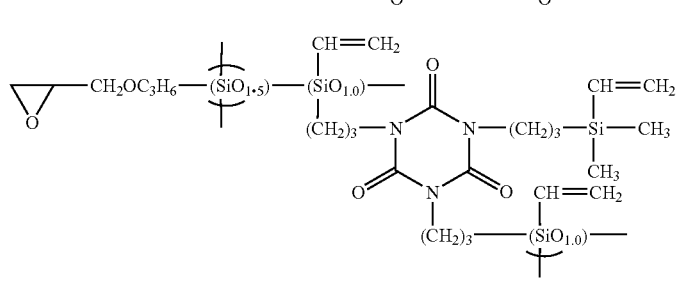

-continued
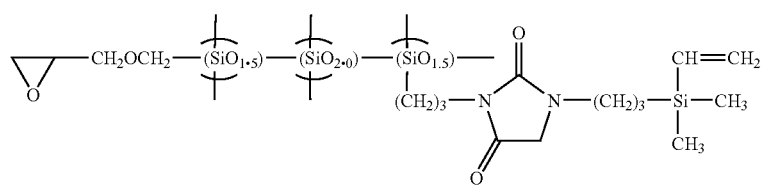
(2-25)
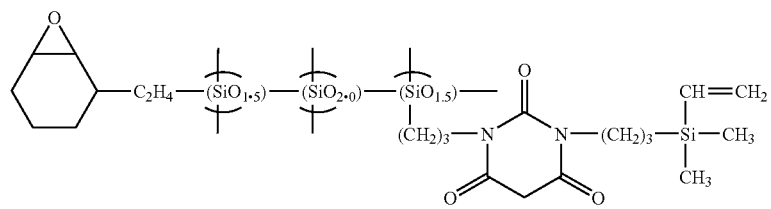
(2-26)
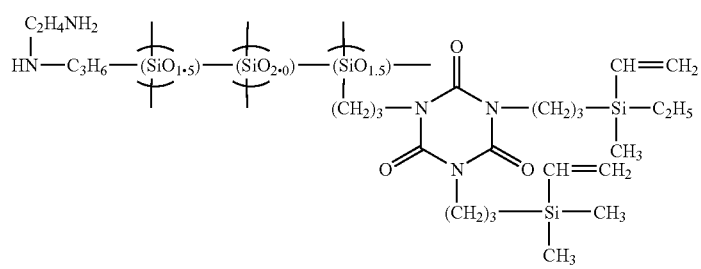
(2-27)
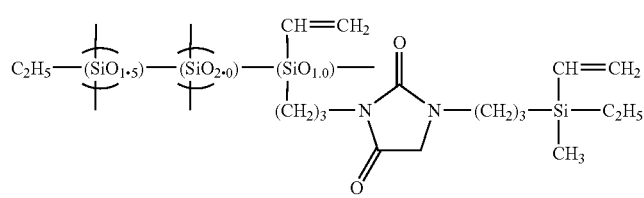
(2-28)
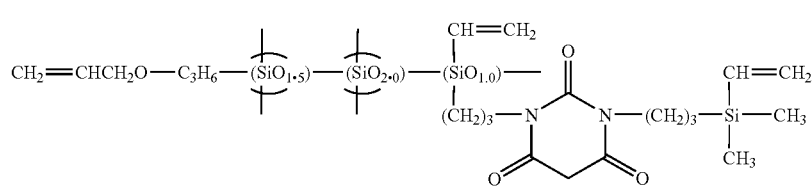
(2-29)
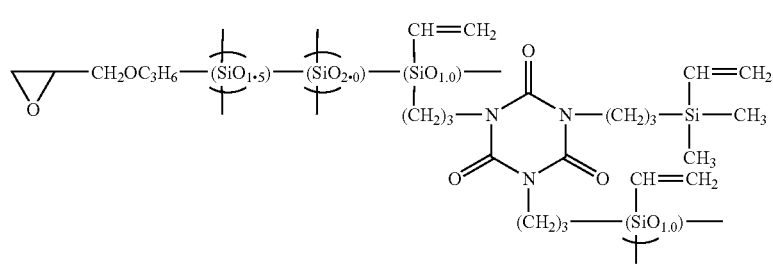
(2-30)
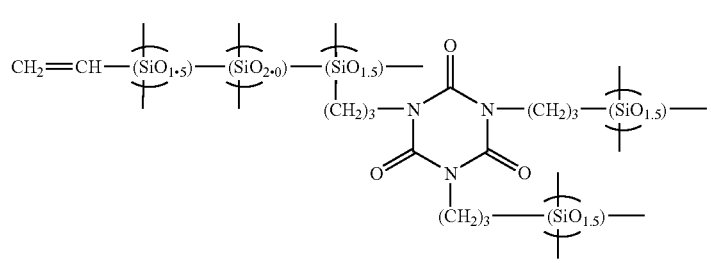
(2-30)

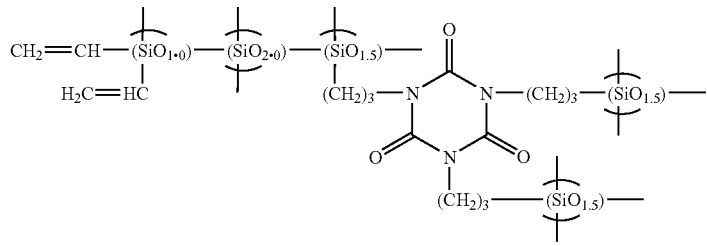
(2-31)
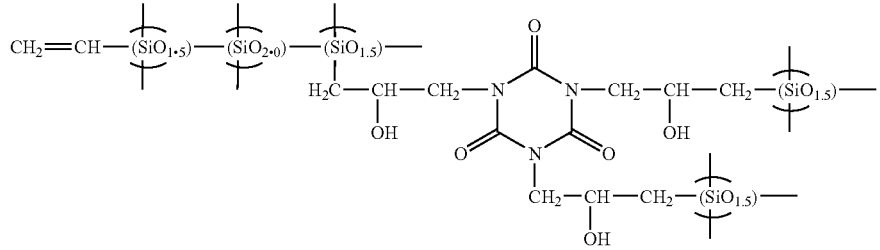
(2-32)
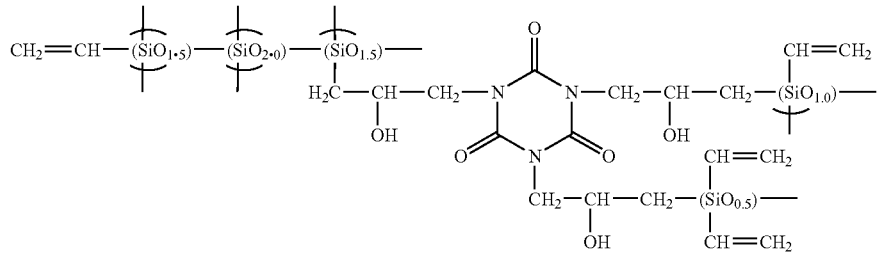
(2-33)
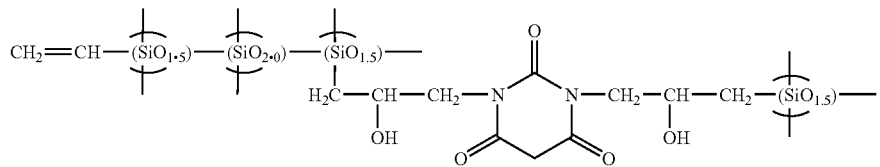
(2-34)
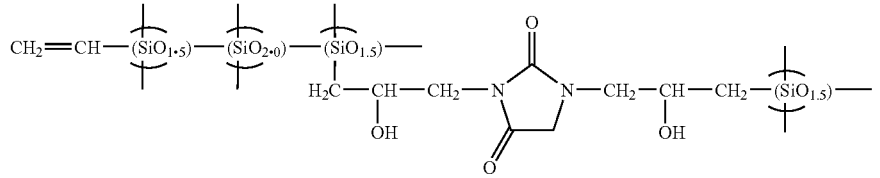
(2-35)
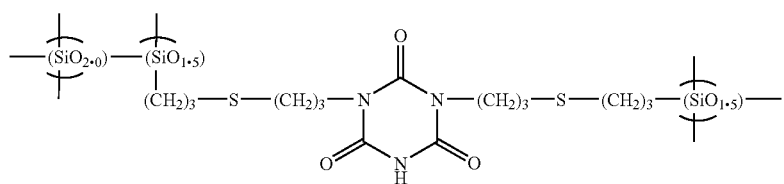
(2-36)
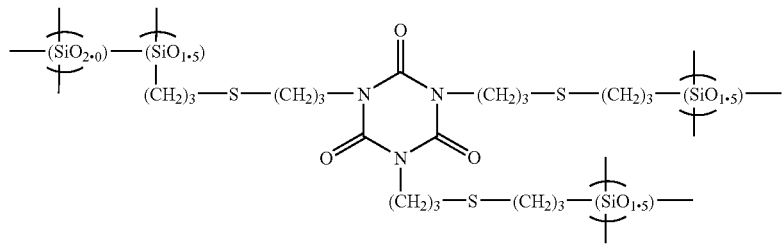
(2-37)

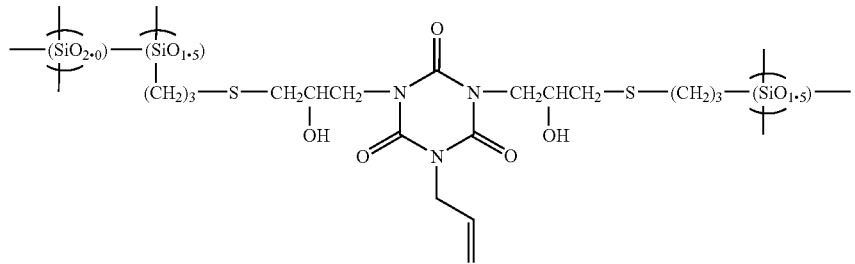

(2-38)

The polymer used in the present invention is a polyorganosiloxane in which a Si—O group exists in the polymer terminal. This Si—OH group effects a thermal crosslinking reaction by using or even without a crosslinking catalyst to form a crosslinkage. In addition, when the polymer has a hydroxy group as a substituent on a nitrogen atom of a triazine ring or the like, the hydroxy group effects a thermal crosslinking reaction to form a crosslinkage.

In the present invention, examples of the crosslinking catalyst include protonic acids.

Examples of the protonic acid include sulfonic acid compounds such as p-toluenesulfonic acid, trifluoromethanesulfonic acid, pyridinium-p-toluenesulfonic acid, sulfosalicylic acid and camphorsulfonic acid. In addition, examples thereof also include carboxylic acid compounds such as salicylic acid, citric acid, benzoic acid and hydroxybenzoic acid.

As the crosslinking catalyst, aromatic sulfonic acid compounds can be preferably used. Specific examples of the aromatic sulfonic acid compound include p-toluenesulfonic acid, pyridinium-p-toluenesulfonic acid, sulfosalicylic acid, 4-chlorobenzenesulfonic acid, 4-hydroxybenzenesulfonic acid, benzenedisulfonic acid, 1-naphthalenesulfonic acid and pyridinium-1-naphthalenesulfonic acid.

These crosslinking catalysts may be used individually or in combination of two or more types thereof.

The used amount of the crosslinking catalyst is 0.1 to 10 parts by mass, or 0.5 to 5 parts by mass, or 1 to 3 parts by mass, relative to 100 parts by mass of the polymer.

The underlayer film forming composition for lithography of the present invention may contain besides the above components, if necessary organic polymer compounds, photoacid generators, surfactants, and the like.

By using an organic polymer compound, there can be controlled the dry etching rate (a decreased amount of the film thickness per unit time), the attenuation coefficient and the refractive index of a resist underlayer film formed from the underlayer film forming composition for lithography of the present invention.

The organic polymer compound is not particularly limited and various organic polymers can be used. For example, condensation-polymerized polymers and addition-polymerized polymers can be used. Specific examples of the addition-polymerized polymer or the condensation-polymerized polymer include polyesters, polystyrenes, polyimides, acrylic polymers, methacrylic polymers, polyvinylethers, phenolnovolacs, naphtholnovolacs, polyethers, polyamides and polycarbonates. There are preferably used an organic polymer having an aromatic ring structure functioning as a light absorbing moiety such as a benzene ring, a naphthalene ring, an anthracene ring, a triazine ring, a quinoline ring and a quinoxaline ring.

Examples of such an organic polymer compound include addition-polymerized polymers containing as a structure unit thereof, an addition-polymerizable monomer such as benzylacrylate, benzylmethacrylate, phenylacrylate, naphthylacrylate, anthrylmethacrylate, anthrylmethylmethacrylate, styrene, hydroxystyrene, benzylvinyl ether and N-phenylmaleimide, and condensation-polymerized polymers such as phenolnovolacs and naphtholnovolacs.

When an addition-polymerized polymer is used as the organic polymer compound, the polymer compound may be either a homopolymer or a copolymer. For producing the addition-polymerized polymer, an addition-polymerizable monomer is used. Examples of such an addition-polymerizable monomer include acrylic acid, methacrylic acid, acrylate ester compounds, methacrylate ester compounds, acrylamide compounds, methacrylamide compounds, vinyl compounds, styrene compounds, maleimide compounds, maleic anhydride and acrylonitrile.

Examples of the acrylate ester compound include methyl acrylate, ethyl acrylate, n-hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane and glycidyl acrylate.

Examples of the methacrylate ester compound include methyl methacrylate, ethyl methacrylate, n-hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate and bromophenyl methacrylate.

Examples of the acrylamide compound include acrylamide, N-methylacrylamide, N-ethylacrylamide, N-benzylacrylamide, N-phenylacrylamide, N,N-dimethylacrylamide and N-anthrylacrylamide.

Examples of the methacrylamide include methacrylamide, N-methylmethacrylamide, N-ethylmethacrylamide, N-benzylmethacrylamide, N-phenylmethacrylamide, N,N-dimethylmethacrylamide and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene and vinylanthracene.

Examples of the styrene compound include styrene, hydroxystyrene, chlorostyrene, bromostyrene, methoxystyrene, cyanostyrene and acetylstyrene.

Examples of the maleimide compound include maleimide, N-methylmaleimide, N-phenylmaleimide, N-cyclohexylmaleimide, N-benzylmaleimide and N-hydroxyethylmaleimide.

When a condensation-polymerized polymer is used as the polymer, examples of such a polymer include condensation-polymerized polymers of a glycol compound and a dicarboxylic acid compound.

Examples of the glycol compound include diethylene glycol, hexamethylene glycol and butylene glycol.

Examples of the dicarboxylic acid compound include succinic acid, adipic acid, terephthalic acid and maleic anhydride.

In addition, examples of the polymer also include polyesters, polyamides and polyimides such as polypyromellitimide, poly(p-phenyleneterephthalamide), polybutyleneterephthalate and polyethyleneterephthalate.

When the organic polymer compound contains a hydroxy group, the hydroxy group can effect a crosslinking reaction with a polyorganosiloxane polymer.

As the organic polymer compound, there can be used a polymer compound having a weight average molecular weight of, for example 1,000 to 1,000,000, or 3,000 to 300,000, or 5,000 to 200,000, or 10,000 to 100,000.

The organic polymer compounds may be used individually or in combination of two or more types thereof.

When the organic polymer compound is used, the content thereof is 1 to 200 parts by mass, or 5 to 100 parts by mass, or 10 to 50 parts by mass, or 20 to 30 parts by mass, relative to 100 parts by mass of the polyorganosiloxane polymer.

The resist underlayer film forming composition of the present invention may contain an acid generator. Examples of the acid generator include thermoacid generators and photoacid generators.

The photoacid generator generates an acid during exposure of the resist. Therefore, the acidity of the underlayer film can be controlled. This is one method for adjusting the acidity of the underlayer film to that of the resist on the underlayer film. In addition, by adjusting the acidity of the underlayer film, the pattern shape of the resist formed on the underlayer film can be controlled.

Examples of the photoacid generator contained in the resist underlayer film forming composition of the present invention include onium salt compounds, sulfonimide compounds and disulfonyl diazomethane compounds.

Examples of the onium salt compound include: iodonium salt compounds such as diphenyliodoniumhexafluorophosphate, diphenyliodoniumtrifluoromethanesulfonate, diphenyliodoniumnonafluoro-n-butanesulfonate, diphenyliodoniumperfluoro-n-octanesulfonate, diphenyliodoniumcamphorsulfonate, bis(4-tert-butylphenypiodoniumcamphorsulfonate and bis(4-tert-butylphenyl)iodoniumtrifluoromethanesulfonate; and sulfonium salt compounds such as triphenylsulfoniumhexafluoroantimonate, triphenylsulfoniumnonafluoro-n-butanesulfonate, triphenylsulfoniumcamphorsulfonate and triphenylsulfoniumtrifluoromethanesulfonate.

Examples of the sulfonimide compound include N-(trifluoromethanesulfonyloxy) succinimide, N-(nonafluoro-n-butanesulfonyloxy) succinimide, N-(camphorsulfonyloxy) succinimide and N-(trifluoromethanesulfonyloxy) naphthalimide.

Examples of the disulfonyldiazomethane compound include bis(trifluoromethylsulfonyl) diazomethane, bis(cyclohexylsulfonyl) diazomethane, bis (phenylsulfonyl) diazomethane, bis(p-toluenesulfonyl) diazomethane, bis(2,4-dimethylbenzenesulfonyl) diazomethane and methylsulfonyl-p-toluenesulfonyldiazomethane.

These photoacid generators may be used individually or in combination of two or more types thereof.

When the photoacid generator is used, the content thereof is 0.01 to 5 parts by mass, or 0.1 to 3 parts by mass, or 0.5 to 1 part by mass, relative to 100 parts by mass of the polymer (polyorganosiloxane-polymer).

The surfactant is effective for suppressing the formation of a pin hole, a striation and the like when the resist underlayer film forming composition for lithography of the present invention is applied on a substrate.

From the hydrolysis-condensate (polymer) obtained by hydrolyzing and condensing an organic silicon compound (hydrolysable organosilane) in a solvent using a catalyst, an alcohol as a by-product and the used hydrolyzing catalyst and water can be simultaneously removed by distilling under reduced pressure or the like. In addition, the acid or the base catalyst used for the hydrolysis can be removed by neutralization or ion-exchange. Then, in the resist underlayer film forming composition for lithography of the present invention containing the hydrolysis-condensate, an organic acid, water, an alcohol or a combination thereof can be blended for the stabilization of the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid and salicylic acid. Among them, oxalic acid and maleic acid are preferred.

The used amount of the organic acid is 0.5 to 10 parts by mass, relative to 100 parts by mass of the condensate (polyorganosiloxane).

In addition, as the water, pure water, ultrapure water, ion-exchanged water or the like can be used and the additive amount thereof can be 1 to 20 parts by mass, relative to 100 parts by mass of the resist underlayer film forming composition.

As the alcohol, an alcohol that is easily scattered by heating after the application is preferred and examples thereof include methanol, ethanol, propanol, isopropanol and butanol.

The used amount of the alcohol can be 1 to 20 parts by mass, relative to 100 parts by mass of the resist underlayer film forming composition.

The resist underlayer film forming composition of the present invention may contain a curing catalyst. The curing catalyst performs a function as a crosslinking catalyst when the coating film containing a polyorganosiloxane composed of a hydrolysis-condensate is heated so that the polyorganosiloxane forms a crosslinkage bond between silanol groups.

As the curing catalyst, there can be used ammonium salts, phosphines and phosphonium salts.

Examples of the ammonium salt include: quaternary ammonium salts having a structure of Formula (D-1):

Formula (D-1)

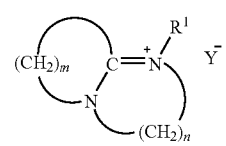

(where m is an integer of 2 to 11; n is an integer of 2 to 3; $R^1$ is an alkyl group or an aryl group; and $Y^-$ is an anion);

quaternary ammonium salts having a structure of Formula (D-2):

  Formula (D-2)

(where $R^2$, $R^3$, $R^4$ and $R^5$ are independently an alkyl group or an aryl group bonded to a nitrogen atom through a C—N bond; N is a nitrogen atom; and $Y^-$ is an anion);
quaternary ammonium salts having a structure of Formula (D-3):

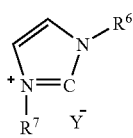  Formula (D-3)

(where $R^6$ and $R^7$ are independently an alkyl group or an aryl group; and $Y^-$ is an anion);
quaternary ammonium salts having a structure of Formula (D-4):

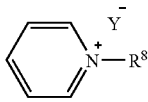  Formula (D-4)

(where $R^8$ is an alkyl group or an aryl group; and $Y^-$ is an anion);
quaternary ammonium salts having a structure of Formula (D-5):

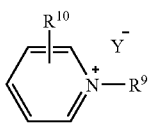  Formula (D-5)

(where $R^9$ and $R^{10}$ are independently an alkyl group or an aryl group; and $Y^-$ is an anion); and
tertiary ammonium salts having a structure of Formula (D-6):

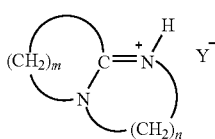  Formula (D-6)

(where m is an integer of 2 to 11; n is an integer of 2 to 3; H is a hydrogen atom; and $Y^-$ is an anion).

In addition, examples of the phosphonium salt include quaternary phosphonium salts having a structure of Formula (D-7):

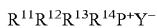  Formula (D-7)

(where $R^{11}$, $R^{12}$, $R^{13}$ and $R^{14}$ are independently an alkyl group or an aryl group bonded to a phosphorus atom through a C—P bond; P is a phosphorus atom; and $Y^-$ is an anion).

The compound of Formula (D-1) is a quaternary ammonium salt derived from an amine and in Formula (D-1), m is an integer of 2 to 11 and n is an integer of 2 to 3. $R^1$ of the quaternary ammonium salt is a $C_{1-18}$, preferably $C_{2-10}$ alkyl group or aryl group and examples thereof include: linear alkyl groups such as an ethyl group, a propyl group and a butyl group; a benzyl group; a cyclohexyl group; a cyclohexylmethyl group; and a dicyclopentadienyl group. In addition, the anion ($Y^-$) can be a halogen ion such as a chlorine ion ($Cl^-$), a bromine ion ($Br^-$) and an iodine ion ($I^-$) or an acid group such as carboxylato (—$COO^-$), sulfonato (—$SO_3^-$) and alcoholate (—$O^-$)

The compound of Formula (D-2) is a quaternary ammonium salt of $R^2R^3R^4R^5N^+Y^-$. $R^2$, $R^3$, $R^4$ and $R^5$ of the quaternary ammonium salt are independently a $C_{1-18}$ alkyl group or aryl group. Examples of the anion ($Y^-$) include: halogen ions such as a chlorine ion ($Cl^-$), a bromine ion ($Br^-$) and an iodine ion ($I^-$); and acid groups such as carboxylato (—$COO^-$), sulfonato (—$SO_3^-$) and alcoholate (—$O^-$).

The quaternary ammonium salt is commercially available and examples thereof include tetramethylammonium acetate, tetrabutylammonium acetate, triethylbenzylammonium chloride, triethylbenzylammonium bromide, trioctylmethylammonium chloride, tributylbenzylammonium chloride and trimethylbenzylammonium chloride.

The compound of Formula (D-3) is a quaternary ammonium salt derived from a 1-substituted imidazole and in Formula (D-3), $R^6$ and $R^7$ are independently $C_{1-18}$ alkyl group and the sum of the numbers of carbon atoms of $R^6$ and $R^7$ is preferably 7 or more. For example, $R^6$ can be a methyl group, an ethyl group, a propyl group, a phenyl group or a benzyl group and $R^7$ can be a benzyl group, an octyl group or an octadecyl group. Examples of the anion ($Y^-$) include: halogen ions such as a chlorine ion ($Cl^-$), a bromine ion ($Br^-$) and an iodine ion ($I^-$); and acid groups such as carboxylato (—$O^-$), sulfonato (—$SO_3^-$) and alcoholate (—$O^-$).

The compound either is commercially available or can be produced, for example by reacting an imidazole-based compound such as 1-methylimidazole and 1-benzylimidazole with a halogenated alkyl or halogenated aryl such as benzyl bromide and methyl bromide.

The compound of Formula (D-4) is a quaternary ammonium salt derived from pyridine and in Formula (D-4), $R^8$ is a $C_{1-18}$, preferably $C_{4-18}$ alkyl group or aryl group and can be, for example a butyl group, an octyl group, a benzyl group or a lauryl group. Examples of the anion ($Y^-$) include: halogen ions such as a chlorine ion ($Cl^-$), a bromine ion ($Br^-$) and an iodine ion ($I^-$); and acid groups such as carboxylato (—$COO^-$), sulfonato (—$SO_3^-$) and alcoholate (—$O^-$).

The compound either is commercially available or can be produced, for example by reacting pyridine with a halogenated alkyl or halogenated aryl such as lauryl chloride, benzyl chloride, benzyl bromide, methyl bromide and octyl bromide.

Examples of the compound include N-laurylpyridinium chloride and N-benzylpyridinium bromide.

The compound of Formula (D-5) is a quaternary ammonium salt derived from a substituted pyridine represented by picoline and the like and in Formula (D-5), $R^9$ is a $C_{1-18}$, preferably $C_{4-18}$ alkyl group or aryl group and can be, for example a methyl group, an octyl group, a lauryl group or a benzyl group. $R^{10}$ is a $C_{1-18}$ alkyl group or aryl group and for example, when the compound is a quaternary ammonium derived from picoline, $R^{10}$ is a methyl group. Examples of the anion ($Y^-$) include: halogen ions such as a chlorine ion ($Cl^-$), a bromine ion ($Br^-$) and an iodine ion ($I^-$); and acid groups such as carboxylato (—$COO^-$), sulfonato (—$SO_3^-$) and alcoholate (—$O^-$).

The compound either is commercially available or can be produced, for example by reacting a substituted pyridine such as picoline with a halogenated alkyl or a halogenated aryl such as methyl bromide, octyl bromide, lauryl chloride, benzyl chloride and benzyl bromide.

Examples of the compound include N-benzylpicolinium chloride, N-benzylpicolinium bromide and N-laurylpicolinium chloride.

The compound of Formula (D-6) is a tertiary ammonium salt derived from an amine and in Formula (D-6), m is an integer of 2 to 11 and n is an integer of 2 to 3. In addition, examples of the anion ($Y^-$) include: halogen ions such as a chlorine ion ($Cl^-$), a bromine ion ($Br^-$) and an iodine ion ($I^-$); and acid groups such as carboxylato ($—COO^-$), sulfonato ($—SO_3^-$) and alcoholate ($—O^-$).

The compound can be produced by a reaction of an amine with a weak acid such as a carboxylic acid and phenol.

Examples of the carboxylic acid include formic acid and acetic acid. When formic acid is used, the anion ($Y^-$) is $HCOO^-$ and when acetic acid is used, the anion ($Y^-$) is $CH_3COO^-$. In addition, when phenol is used, the anion ($Y^-$) is $C_6H_5O^-$.

The compound of Formula (D-7) is a quaternary phosphonium salt having a structure of $R^{11}R^{12}R^{13}R^{14}P^+Y^-$.

$R^{11}$, $R^{12}$, $R^{13}$ and $R^{14}$ are independently a $C_{1-18}$ alkyl group or aryl group. Preferably, three groups among $R^{11}$ to $R^{14}$ are a phenyl group or a substituted phenyl group such as a phenyl group and a tolyl group and the remaining one group is a $C_{1-18}$ alkyl group or aryl group. In addition, examples of the anion ($Y^-$) include: halogen ions such as a chlorine ion ($Cl^-$), a bromine ion ($Br^-$) and an iodine ion ($I^-$); and acid groups such as carboxylato ($—COO^-$), sulfonato ($—SO_3^-$) and alcoholate ($—O^-$).

The compound is commercially available and examples of the compound include: halogenated tetraalkylphosphoniums such as a halogenated tetra-n-butylphosphonium and a halogenated tetra-n-propylphosphonium; halogenated trialkylbenzylphosphoniums such as a halogenated triethylbenzylphosphonium; halogenated triphenylmonoalkylphosphoniums such as a halogenated triphenylmethylphosphonium and a halogenated triphenylethylphosphonium; halogenated triphenylbenzylphosphoniums; halogenated tetraphenylphosphoniums; halogenated tritolylmonoarylphosphoniums; and halogenated tritolylmonoalkylphosphoniums (where, the halogen atom is a chlorine atom or a bromine atom).

Particularly preferred examples of the compound include: halogenated triphenylmonoalkylphosphoniums such as a halogenated triphenylmethylphosphonium and a halogenated triphenylethylphosphonium; halogenated triphenylmonoarylphosphoniums such as a halogenated triphenylbenzylphosphonium; halogenated tritolylmonoarylphosphoniums such as a halogenated tritolylmonophenylphosphonium; and halogenated tritolylmonoalkylphosphoniums such as a halogenated tritolylmonomethylphosphonium (where, the halogen atom is a chlorine atom or a bromine atom).

In addition, examples of the phosphines include: primary phosphines such as methylphosphine, ethylphosphine, propylphosphine, isopropylphosphine, isobutylphosphine and phenylphosphine; secondary phosphines such as dimethylphosphine, diethylphosphine, diisopropylphosphine, diisoamylphosphine, and diphenylphosphine; tertially phosphines such as trimethylphosphine, triethylphosphine, triphenylphosphine, methyldiphenylphosphine and dimethylphenylphosphine.

The used amount of the curing catalyst is 0.01 to 10 parts by mass, or 0.01 to 5 parts by mass, or 0.01 to 3 parts by mass, relative to 100 parts by mass of the condensate (polyorganosiloxane).

Examples of the surfactant contained in the resist underlayer film forming composition of the present invention include: nonionic surfactants, for example polyoxyethylene alkyl ethers such as polyoxyethylene lauryl ether, polyoxyethylene stearyl ether, polyoxyethylene cetyl ether and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorinated surfactants, for example EFTOP EF301, EF303 and EF352 (trade name; manufactured by Tohkem Products Co., Ltd.), MEGAFAC F171, F173, R-08 and R-30 (trade name; manufactured by DIC Corporation), Fluorad FC430 and FC431 (trade name; manufactured by Sumitomo 3M Limited), AsahiGuard AG710 and Surflon S-382, SC101, SC102, SC103, SC104, SC105 and SC106 (trade name; manufactured by Asahi Glass Co., Ltd.); and Organosiloxane polymer KP341 (manufactured by Shin-Etsu Chemical Co., Ltd.).

These surfactants may be used individually or in combination of two or more types thereof.

When the surfactant is used, the content thereof is 0.0001 to 5 parts by mass, or 0.001 to 1 part by mass, or 0.01 to 0.5 parts by mass, relative to 100 parts by mass of the polymer (polyorganosiloxane polymer).

In addition, in the resist underlayer film forming composition of the present invention, a rheology controlling agent and an adhesion assistant may be blended.

The rheology controlling agent is effective for enhancing the fluidity of the underlayer film forming composition. The adhesion assistant is effective for enhancing the adhesion of the underlayer film to the semiconductor substrate or the resist.

The solvent used for the resist underlayer film forming composition of the present invention is not particularly limited so long as the solvent can dissolve the above solid content.

Examples of such a solvent include methyl cellosolve acetate, ethyl cellosolve acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone and γ-butyrolactone.

These solvents may be used individually or in combination of two or more types thereof.

Hereinafter, the use of the resist underlayer film forming composition of the present invention is described.

The resist underlayer film forming composition of the present invention is applied on a substrate used in the production of semiconductor devices (for example, silicon wafer substrates, silicon/silicon dioxide coated substrates, silicon nitride substrates, glass substrates, ITO substrates, polyimide substrates, low dielectric constant material (low-k material) coated substrates, etc.) by an appropriate coating method such as spinner and coater and then, is baked to form a resist underlayer film.

The baking conditions are accordingly selected from baking temperature of 80° C. to 250° C. and baking time of 0.3 minutes to 60 minutes.

Preferably, the baking temperature is 150° C. to 250° C. and the baking time is 0.5 minutes to 2 minutes.

Here, the formed resist underlayer film has a thickness of, for example 10 to 1,000 nm, or 30 to 300 nm, or 30 to 200 nm.

Next, on the resist underlayer film, for example, a photoresist layer is formed. The formation of the photoresist layer can be performed by a known method, that is, by applying a photoresist composition solution on the underlayer film and by baking the composition solution.

The photoresist has a film thickness of, for example 50 to 10,000 nm, or 100 to 2,000 nm, or 200 to 1,000 nm.

The photoresist formed on the resist underlayer film of the present invention is not particularly limited so long as it is sensitive to light used for the exposure, and both of a negative-type photoresist and a positive-type photoresist can be used. Examples of the photoresist include: a positive-type photoresist containing a novolac resin and 1,2-naphthoquinonediazide sulfonate ester; a chemical amplification-type photoresist containing a binder having a group elevating the alkali dissolving rate by being decomposed by an acid, and a photoacid generator; a chemical amplification-type photoresist containing a low molecule compound elevating the alkali dissolving rate of a photoresist by being decomposed by an acid, an alkali-soluble binder and a photoacid generator; and a chemical amplification-type photoresist containing a binder having a group elevating the alkali dissolving rate by being decomposed by an acid, a low molecule compound elevating the alkali dissolving rate of a photoresist by being decomposed by an acid and a photoacid generator.

Specific examples of the photoresist include APEX-E (trade name; manufactured by Shipley Company L.L.C.), PAR710 (trade name; manufactured by Sumitomo Chemical Co., Ltd.), and SEPR430 (trade name; manufactured by Shin-Etsu Chemical Co., Ltd.) In addition, the specific examples also include fluorine atom-containing polymer-based photoresists described in Proc. SPIE, Vol. 3999, p 330 to 334 (2000), Proc. SPIE, Vol. 3999, p 357 to 364 (2000) and Proc. SPIE, Vol. 3999, p 365 to 374 (2000).

Next, the exposure is performed through a predetermined mask. For the exposure, a KrF excimer laser (wavelength: 248 nm), an ArF excimer laser (wavelength: 193 nm) and an F2 excimer laser (wavelength: 157 nm) can be used. After the exposure, if necessary, post exposure bake can be also performed. The post exposure bake is performed under conditions accordingly selected from heating temperature of 70° C. to 150° C. and heating time of 0.3 minutes to 10 minutes.

In addition, in the present invention, as the resist, a resist for electron beam lithography can be used instead of the photoresist. As the electron beam resist, both a positive type and a negative type can be used. Examples of the electron beam resist include: a chemical amplification-type resist containing an acid generator and a binder having a group changing the alkali dissolving rate by being decomposed by an acid; a chemical amplification-type resist containing an alkali-soluble binder, an acid generator, and a low molecule compound changing the alkali dissolving rate of a resist by being decomposed by an acid; a chemical amplification-type resist containing an acid generator, a binder having a group changing the alkali dissolving rate by being decomposed by an acid, and a low molecule compound changing the alkali dissolving rate of a resist by being decomposed by an acid; a non-chemical amplification-type resist containing a binder having a group changing the alkali dissolving rate by being decomposed by an electron beam; and a non-chemical amplification-type resist containing a binder having a site changing the alkali dissolving rate by being broken by an electron beam.

A resist pattern can also be formed by using the above electron beam resists, in substantially the same manner as in the case of using a photoresist, in which an electron beam is used as the radiating source.

Next, development is performed by a developer. Consequently, for example when a positive-type photoresist is used, the photoresist of an exposed part is removed to form a photoresist pattern.

Examples of the developer include alkaline aqueous solutions such as: aqueous solutions of alkali metal hydroxides such as potassium oxide and sodium oxide; aqueous solutions of quaternary ammonium hydroxides such as tetramethylammonium hydroxide, tetraethylammonium hydroxide and choline; and aqueous solutions of amines such as ethanolamine, propylamine and ethylenediamine.

Further, in these developers, a surfactant and the like may be also blended.

The conditions for the development are accordingly selected from temperature of 5 to 50° C. and time of 10 to 300 seconds.

Then, using the thus formed pattern of the photoresist (upper layer) as a protecting film, the removal of the resist underlayer film (intermediate layer) of the present invention is performed and next, using the film composed of the patterned photoresist and the patterned resist underlayer film (intermediate layer) of the present invention as a protecting film, the removal of the organic underlayer film (underlayer) is performed. Finally, using the patterned resist underlayer film (intermediate layer) of the present invention and the patterned organic underlayer film (underlayer) as a protecting film, the processing of the semiconductor substrate is performed.

First, the resist underlayer film (intermediate layer) of the present invention at the part where the photoresist is removed is removed by dry etching to expose the semiconductor substrate. For dry etching the resist underlayer film of the present invention, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, trichloroborane and dichloroborane. For dry etching the resist underlayer film, a chlorine-based gas is preferably used. By dry etching with a chlorine-based gas, fundamentally, a photoresist composed of organic substances is difficult to be removed. On the contrary, the resist underlayer film of the present invention containing a large amount of silicon atoms can be immediately removed by a chlorine-based gas. Therefore, the decrease of the film thickness of the photoresist according to dry etching of the resist underlayer film can be suppressed. Then, as a result, the photoresist can be used as a thin film. Examples of the chlorine-based gas include dichloroborane, trichloroborane, chlorine, carbon tetrachloride and chloroform.

Subsequently, using the film composed of the patterned photoresist and the patterned resist underlayer film of the present invention as a protecting film, the removal of the organic underlayer film is performed. The removal of the organic underlayer film (underlayer) is performed by dry etching preferably with an oxygen-based gas. This is because the resist underlayer film of the present invention containing a large amount of silicon atoms is difficult to be removed by dry etching with an oxygen-based gas.

Finally, the processing of the semiconductor substrate is performed. The processing of the semiconductor substrate is preferably performed by dry etching with a fluorine-based gas.

Examples of the fluorine-based gas include tetrafluoromethane ($CF_4$), perfluorocyclobutane ($C_4F_8$), perfluoropropane ($C_3F_8$), trifluoromethane and difluoromethane ($CH_2F_2$).

In addition, as an upper layer of the resist underlayer film of the present invention, an organic bottom anti-reflective coating can be formed before the formation of the photoresist. The bottom anti-reflective coating composition used here is not particularly limited and can be optionally selected from the compositions commonly used in a related art lithography process. In addition, the formation of the bottom anti-reflective coating can be performed by a commonly used method, for example by applying a bottom anti-reflective coating composition by a spinner or a coater and by baking the composition.

In the present invention, after forming the organic underlayer film on the substrate, the resist underlayer film of the present invention can be formed on the organic underlayer film and further, the resist underlayer film can be coated with the photoresist. Thus, even when the pattern width of the photoresist becomes smaller and the photoresist is coated thinly for preventing a pattern collapse, the processing of the substrate becomes possible by selecting an appropriate etching gas. For example, the resist underlayer film of the present invention can be processed by using a chlorine-based gas having an etching rate of the resist underlayer film satisfactorily higher than that of the photoresist as an etching gas, and the organic underlayer film can be processed by using an oxygen-based gas having an etching rate of the organic underlayer film satisfactorily higher than that of the resist underlayer film of the present invention as an etching gas. Further, the substrate can be processed by using a fluorine-based gas having an etching rate of the substrate satisfactorily higher than that of the organic underlayer film as an etching gas.

In addition, the substrate on which the resist underlayer film forming composition of the present invention is applied may be also a substrate having an inorganic bottom anti-reflective coating formed by a CVD method on the surface of the substrate and on the bottom anti-reflective coating, the underlayer film of the present invention can be also formed.

In addition, a resist underlayer film formed from the resist underlayer film forming composition of the present invention may absorb light used in a lithography process depending on the wavelength of the light. Then, in such a case, the resist underlayer film can function as a bottom anti-reflective coating having the effect of preventing a reflection light on the substrate. Further, the underlayer film of the present invention can be also used as a layer for preventing an interaction between the substrate and the photoresist, a layer having a function of preventing an adverse action of a material used in the photoresist or a substance generated during exposure of the photoresist against the substrate, a layer having a function of preventing the diffusion of a substance generated in or on the substrate during heating-baking to the upper layer photoresist, or a barrier layer for reducing a poisoning effect to the photoresist layer by a semiconductor substrate dielectric layer.

In addition, a resist underlayer film formed from the resist underlayer film forming composition of the present invention can be applied to a substrate in which a via hole used in the dual damascene process is formed to be used as an embedding material capable of filling the hole without a void. In addition, the resist underlayer film can be also used as a planarizing material for planarizing the surface of a semiconductor substrate having unevenness.

Hereinafter, the present invention will be more specifically described referring to Examples which should not be construed as limiting the scope of the present invention.

EXAMPLES

Synthesis Example 1

Synthesis of ICY 100

58.36 g of tris(3-trimethoxysilylpropyl)-isocyanurate and 136.17 g of ethanol were charged into a 300 mL flask to dissolve them and the resultant mixed solution was warmed while stirring the mixed solution with a magnetic stirrer to reflux. Next, an aqueous solution in which 0.35 g of hydrochloric acid was dissolved in 4.37 g of ion-exchanged water, was added to the mixed solution. The reaction was effected for 120 minutes and the resultant reaction solution was cooled down to the room temperature. Subsequently, 200 g of propylene glycol monomethyl ether acetate was added to the reaction solution and methanol, ethanol, water and hydrochloric acid as reaction by-products were distilled off under reduced pressure to produce a hydrolysis-condensate solution. The weight average molecular weight Mw of the obtained polymer was measured by GPC and found to be 7,000 as converted into that of polystyrene.

Synthesis Example 2

Synthesis of ICY 60

47.52 g of tris(3-trimethoxysilylpropyl)-isocyanurate, 10.72 g of tetraethoxysilane and 135.89 g of ethanol were charged into a 300 mL flask to dissolve them and the resultant mixed solution was warmed while stirring the mixed solution with a magnetic stirrer to reflux. Next, an aqueous solution in which 0.47 g of hydrochloric acid was dissolved in 5.40 g of ion-exchanged water, was added to the mixed solution. The reaction was effected for 120 minutes and the resultant reaction solution was cooled down to the room temperature. Subsequently, 200 g of propylene glycol monomethyl ether acetate was added to the reaction solution and methanol, ethanol, water and hydrochloric acid as reaction by-products were distilled off under reduced pressure to produce a hydrolysis-condensate solution. The weight average molecular weight Mw of the obtained polymer was measured by GPC and found to be 9,000 as converted into that of polystyrene.

Synthesis Example 3

Synthesis of ICY 20

24.64 g of tris(3-trimethoxysilylpropyl)-isocyanurate, 33.34 g of tetraethoxysilane and 135.29 g of ethanol were charged into a 300 mL flask to dissolve them and the resultant mixed solution was warmed while stirring the mixed solution with a magnetic stirrer to reflux. Next, an aqueous solution in which 0.73 g of hydrochloric acid was dissolved in 6.00 g of ion-exchanged water, was added to the mixed solution. The reaction was effected for 60 minutes and the resultant reaction solution was cooled down to the room temperature. Subsequently, 225 g of propylene glycol monomethyl ether acetate was added to the reaction solution and methanol, ethanol, water and hydrochloric acid as reaction by-products were distilled off under reduced pressure to produce a hydrolysis-condensate solution. The weight average molecular weight Mw of the obtained polymer was measured by GPC and found to be 26,000 as converted into that of polystyrene.

Synthesis Example 4

Synthesis of ICY 10

22.71 g of tris(3-trimethoxysilylpropyl)-isocyanurate, 69.14 g of tetraethoxysilane and 91.86 g of ethanol were charged into a 300 mL flask to dissolve them and the resultant mixed solution was warmed while stirring the mixed solution with a magnetic stirrer to reflux. Next, an aqueous solution in which 1.34 g of hydrochloric acid was dissolved in 14.94 g of ion-exchanged water, was added to the mixed solution. The reaction was effected for 60 minutes and the resultant reaction solution was cooled down to the room temperature. Subsequently, 177.62 g of propylene glycol monomethyl ether acetate was added to the reaction solution and methanol, ethanol, water and hydrochloric acid as reaction by-products were distilled off under reduced pressure to produce a hydrolysis-condensate solution. The weight average molecular weight Mw of the obtained polymer was measured by GPC and found to be 20,000 as converted into that of polystyrene.

Synthesis Example 5

9.80 g of 3-mercaptopropyltrimethoxysilane, 5.00 g of diallyl isocyanurate, 0.20 g of azobisisobutyronitrile and 15.0 g of methyl ethyl ketone were charged into a 50 mL flask and the inside of the flask was nitrogen-purged using a nitrogen balloon and a diaphragm pump, followed by heating-refluxing the resultant reaction mixture for 7 hours. From the resultant reaction solution, methyl ethyl ketone was distilled off under reduced pressure to produce the objective compound (1-22).

1.20 g of the compound (1-22), 1.66 g of tetraethoxysilane and 6.70 g of ethanol were charged into a 50 mL flask to dissolve them and the resultant mixed solution was warmed while stirring the mixed solution with a magnetic stirrer to reflux. Next, an aqueous solution in which 0.04 g of hydrochloric acid was dissolved in 0.51 g of ion-exchanged water, was added to the mixed solution. The reaction was effected for 30 minutes and the resultant reaction solution was cooled down to the room temperature. Subsequently, 10.00 g of propylene glycol monomethyl ether acetate was added to the reaction solution and methanol, ethanol, water and hydrochloric acid as reaction by-products were distilled off under reduced pressure to produce a hydrolysis-condensate solution. The obtained polymer corresponded to Formula (2-36) and the weight average molecular weight Mw thereof was measured by GPC and found to be 11,000 as converted into that of polystyrene.

Synthesis Example 6

11.81 g of 3-mercaptopropyltrimethoxysilane, 5.00 g of triallyl isocyanurate, 0.25 g of azobisisobutyronitrile and 17.0 g of methyl ethyl ketone were charged into a 50 mL flask and the inside of the flask was nitrogen-purged using a nitrogen balloon and a diaphragm pump, followed by heating-refluxing the resultant reaction mixture for 7 hours. From the resultant reaction solution, methyl ethyl ketone was distilled off under reduced pressure to produce the objective compound (1-23).

1.68 g of the compound (1-23), 1.67 g of tetraethoxysilane and 6.70 g of ethanol were charged into a 50 mL flask to dissolve them and the resultant mixed solution was warmed while stirring the mixed solution with a magnetic stirrer to reflux. Next, an aqueous solution in which 0.04 g of hydrochloric acid was dissolved in 0.51 g of ion-exchanged water, was added to the mixed solution. The reaction was effected for 30 minutes and the resultant reaction solution was cooled down to the room temperature. Subsequently, 11.63 g of propylene glycol monomethyl ether acetate was added to the reaction solution and methanol, ethanol, water and hydrochloric acid as reaction by-products were distilled off under reduced pressure to produce a hydrolysis-condensate solution. The obtained polymer corresponded to Formula (2-37) and the weight average molecular weight Mw thereof was measured by GPC and found to be 23,000 as converted into that of polystyrene.

Synthesis Example 7

17.48 g of 3-mercaptopropyltrimethoxysilane, 12.52 g of monoallyldiglycidyl, isocyanurate and 30 g of cyclohexanone were charged into a 100 mL reaction flask and the resultant reaction mixture was heating-refluxed for 7 hours. From the resultant reaction solution, cyclohexanone was distilled off under reduced pressure to produce the objective compound (1-24).

1.35 g of the compound (1-24), 1.67 g of tetraethoxysilane and 7.03 g of ethanol were charged into a 50 mL flask to dissolve them and the resultant mixed solution was warmed while stirring the mixed solution with a magnetic stirrer to reflux. Next, an aqueous solution in which 0.04 g of hydrochloric acid was dissolved in 0.51 g of ion-exchanged water, was added to the mixed solution. The reaction was effected for 30 minutes and the resultant reaction solution was cooled down to the room temperature. Subsequently, 10.59 g of propylene glycol monomethyl ether acetate was added to the reaction solution and methanol, ethanol, water and hydrochloric acid as reaction by-products were distilled off under reduced pressure to produce a hydrolysis-condensate solution. The obtained polymer corresponded to Formula (2-38) and the weight average molecular weight Mw thereof was measured by GPC and found to be 14,000 as converted into that of polystyrene.

Comparative Synthesis Example 1

Synthesis of ICY 0 (TEOS 100)

84.63 g of tetraethoxysilane and 84.63 g of ethanol were charged into a 300 mL flask to dissolve them and the resultant mixed solution was warmed while stirring the mixed solution with a magnetic stirrer to reflux. Next, an aqueous solution in which 1.48 g of hydrochloric acid was dissolved in 29.26 g of ion-exchanged water, was added to the mixed solution. The reaction was effected for 60 minutes and the resultant reaction solution was cooled down to the room temperature. Subsequently, 200 g of propylene glycol monomethyl ether acetate was added to the reaction solution and ethanol, water and hydrochloric acid as reaction by-products were distilled off under reduced pressure to produce a hydrolysis-condensate solution. The weight average molecular weight Mw of the obtained polymer was measured by GPC and found to be 6,200 as converted into that of polystyrene.

Example 1

To 5.0 g of a solution (polymer concentration: 15% by mass) containing the polymer obtained in Synthesis Example 1, 25.0 g of propylene glycol monomethyl ether acetate was added to prepare a resist underlayer film forming composition.

Example 2

To 5.0 g of a solution (polymer concentration: 15% by mass) containing the polymer obtained in Synthesis Example 2, 25.0 g of propylene glycol monomethyl ether acetate was added to prepare a resist underlayer film forming composition.

Example 3

To 5.0 g of a solution (polymer concentration: 15% by mass) containing the polymer obtained in Synthesis Example 3, 25.0 g of propylene glycol monomethyl ether acetate was added to prepare a resist underlayer film forming composition.

Example 4

To 5.0 g of a solution (polymer concentration: 15% by mass) containing the polymer obtained in Synthesis Example 4, 25.0 g of propylene glycol monomethyl ether acetate was added to prepare a resist underlayer film forming composition.

Example 5

To 5.0 g of a solution (polymer concentration: 15% by mass) containing the polymer obtained in Synthesis Example 5, 25.0 g of propylene glycol monomethyl ether acetate was added and the resultant mixture was filtered with a 0.05 μm filter to prepare a resist underlayer film forming composition.

Example 6

To 5.0 g of a solution (polymer concentration: 15% by mass) containing the polymer obtained in Synthesis Example 6, 25.0 g of propylene glycol monomethyl ether acetate was added and the resultant mixture was filtered with a 0.05 μm filter to prepare a resist underlayer film forming composition.

Example 7

To 5.0 g of a solution (polymer concentration: 15% by mass) containing the polymer obtained in Synthesis Example 7, 25.0 g of propylene glycol monomethyl ether acetate was added and the resultant mixture was filtered with a 0.05 μm filter to prepare a resist underlayer film forming composition.

Example 8

To 10.0 g of a solution (polymer concentration: 15% by mass) containing the polymer obtained in Synthesis Example 3, 0.015 g of maleic acid, 0.005 g of benzyltriethylammonium chloride, 0.66 g of propylene glycol monomethyl ether acetate, 22.37 g of propylene glycol monoethyl ether and 3.66 g of distilled water were added and the resultant mixture was filtered with a 0.05 μm filter to prepare a resist underlayer film forming composition.

Example 9

To 10.0 g of a solution (polymer concentration: 15% by mass) containing the polymer obtained in Synthesis Example 3, 0.015 g of maleic acid, 0.005 g of benzyltriethylammonium chloride, 0.0075 g of a photoacid generator (trade name: TPS105; manufactured by Midori Kagaku Co., Ltd.), 0.66 g of propylene glycol monomethyl ether acetate, 22.37 g of propylene glycol monoethyl ether and 3.66 g of distilled water were added and the resultant mixture was filtered with a 0.05 μm filter to prepare a resist underlayer film forming composition.

Example 10

To 10.0 g of a solution (polymer concentration: 15% by mass) containing the polymer obtained in Synthesis Example 5, 0.015 g of maleic acid, 0.005 g of benzyltriethylammonium chloride, 0.66 g of propylene glycol monomethyl ether acetate, 22.37 g of propylene glycol monoethyl ether and 3.66 g of distilled water were added and the resultant mixture was filtered with a 0.05 μm filter to prepare a resist underlayer film forming composition.

Example 11

To 10.0 g of a solution (polymer concentration: 15% by mass) containing the polymer obtained in Synthesis Example 6, 0.015 g of maleic acid, 0.005 g of benzyltriethylammonium chloride, 0.66 g of propylene glycol monomethyl ether acetate, 22.37 g of propylene glycol monoethyl ether and 3.66 g of distilled water were added and the resultant mixture was filtered with a 0.05 μm filter to prepare a resist underlayer film forming composition.

Example 12

To 10.0 g of a solution (polymer concentration: 15% by mass) containing the polymer obtained in Synthesis Example 7, 0.015 g of maleic acid, 0.005 g of benzyltriethylammonium chloride, 0.66 g of propylene glycol monomethyl ether acetate, 22.37 g of propylene glycol monoethyl ether and 3.66 g of distilled water were added and the resultant mixture was filtered with a 0.05 μm filter to prepare a resist underlayer film forming composition.

Comparative Example 1

To 2.3 g of a solution (polymer concentration: 30% by mass) containing the polymer obtained in Comparative Synthesis Example 1, 3.3 g of propylene glycol monomethyl ether acetate was added to prepare a resist underlayer film forming composition.
(Solvent Resistance Test)

The resist underlayer film forming compositions prepared in Examples 1 to 12 and Comparative Example 1 were applied on a silicon wafer by a spin coating method and were baked on a hot plate at 240° C. for 1 minute to form a resist underlayer film. Subsequently, the formed resist underlayer film was immersed in propylene glycol monomethyl ether acetate used as a solvent for the over coating resist composition for 1 minute and a resist underlayer film in which the change of the film thickness of the resist underlayer film between before and after the immersion was 2 nm or less, was evaluated as "advantageous" (shown by "A" in Table 1).

TABLE 1

| Result of solvent resistance test | |
|---|---|
| Example 1 | A |
| Example 2 | A |
| Example 3 | A |
| Example 4 | A |
| Example 5 | A |
| Example 6 | A |
| Example 7 | A |
| Example 8 | A |
| Example 9 | A |
| Example 10 | A |
| Example 11 | A |
| Example 12 | A |
| Comparative Example 1 | A |

(Optical Constants)

The resist underlayer film forming compositions prepared in Examples 1 to 12 and Comparative Example 1 were applied on a silicon wafer using a spinner. The composition was heated on a hot plate at 240° C. for 1 minute to form a resist underlayer film (having a film thickness of 0.09 μm). Then, the refractive index (n values) and the optical absorptivity (k values; also called attenuation coefficients) at wavelength of 193 nm of the resist underlayer film were measured using a spectro-ellipsometer (trade name: VUV-VASE VU-302; manufactured by J.A.Woollam Corporation). The result of the measurement is shown in Table 2.

TABLE 2

| Refractive index n and optical absorptivity k | | |
|---|---|---|
| | Refractive index n (wavelength 193 nm) | Optical absorptivity k (wavelength 193 nm) |
| Example 1 | 1.71 | 0.16 |
| Example 2 | 1.71 | 0.14 |
| Example 3 | 1.64 | 0.14 |
| Example 4 | 1.61 | 0.08 |
| Example 5 | 1.77 | 0.12 |
| Example 6 | 1.74 | 0.12 |
| Example 7 | 1.73 | 0.13 |
| Example 8 | 1.63 | 0.15 |
| Example 9 | 1.63 | 0.16 |
| Example 10 | 1.75 | 0.13 |
| Example 11 | 1.72 | 0.13 |
| Example 12 | 1.72 | 0.13 |
| Comparative Example 1 | 1.48 | 0.00 |

(Measurement of Dry Etching Rate)

Etchers/etching gases used in the measurement of dry etching rates are as follows.
ES401 (manufactured by Nippon Scientific Co., Ltd): $CF_4$
RIE-10NR (manufactured by Samco, Inc.): $O_2$ The solutions of resist underlayer film forming compositions prepared in Examples 1 to 12 and Comparative Example 1 were applied on a silicon wafer using a spinner. The composition solution was heated on a hot plate at 240° C. for 1 minute to form a resist underlayer film and using each of the etching gases, the etching rate of the composition was measured. For a resist underlayer film having a film thickness of 0.20 μm, $CF_4$ gas was used as the etching gas to measure the etching rate and for a resist underlayer film having a film thickness of 0.08 μm, $O_2$ gas was used as an etching gas to measure the etching rate.

In addition, in substantially the same manner, a photoresist solution (trade name: UV 113; manufactured by Shipley Company L.L.C.) was applied on a silicon wafer using a spinner to form each of a resist film of 0.20 μm and a resist film of 0.08 μm. For a resist film having a film thickness of 0.20 μm, $CF_4$ gas was used as the etching gas to measure the etching rate and for a resist film having a film thickness of 0.08 μm, $O_2$ gas was used as an etching gas to measure the etching rate. Then, the dry etching rates of the resist underlayer film and those of the resist film were compared with each other. The result is shown in Table 3. The rate ratio is a dry etching rate ratio of (resist underlayer film)/(resist).

TABLE 3

| Dry etching rate ratio | | |
|---|---|---|
| | $CF_4$ (resist ratio) | $O_2$ (resist ratio) |
| Example 1 | 2.48 | 0.08 |
| Example 2 | 2.51 | 0.08 |
| Example 3 | 2.46 | 0.05 |
| Example 4 | 2.38 | 0.04 |
| Example 5 | 2.51 | 0.05 |
| Example 6 | 2.48 | 0.06 |
| Example 7 | 2.45 | 0.05 |
| Example 8 | 2.43 | 0.04 |
| Example 9 | 2.43 | 0.04 |
| Example 10 | 2.47 | 0.04 |
| Example 11 | 2.48 | 0.05 |
| Example 12 | 2.45 | 0.04 |
| Comparative Example 1 | 1.32 | 0.01 |

The resist underlayer film obtained from the resist underlayer film forming composition of the present invention has a satisfactorily high dry etching rate in comparison with that of the photoresist film.

INDUSTRIAL APPLICABILITY

The resist underlayer film obtained from the resist underlayer film forming composition of the present invention has a high dry etching rate. Accordingly, the resist underlayer film has an etching rate high enough to be able to transfer the resist pattern to an underlayer, even when the resist film is formed thinly for preventing the pattern collapse according to the miniaturization of the pattern size.

The invention claimed is:

1. A resist underlayer film for lithography that is provided between a semiconductor substrate and a resist, the resist underlayer film being formed from a film forming composition that comprises a polymer containing a partial structure of Formula (1):

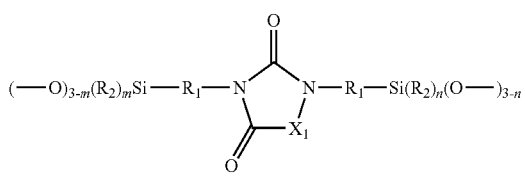

Formula (1)

[where $X_1$ is a group of Formula (2), Formula (3), Formula (4) or Formula (4-1):

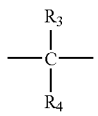

Formula (2)

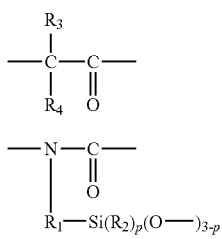

Formula (3)

Formula (4)

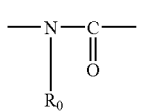

Formula (4-1)

$R_0$ is a hydrogen atom, an alkyl group, an aryl group or an alkenyl group, $R_1$s are independently a divalent organic group, $R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group, O— is an oxygen-containing group of atoms bonded to a silicon atom through a Si—O bond, $R_3$ and $R_4$ are independently a hydrogen atom, a $C_{1-10}$ alkyl group, a $C_{3-6}$ alkenyl group, a benzyl group or a phenyl group (where, the phenyl group is optionally substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or $R_3$ and $R_4$ form together with a carbon atom to which $R_3$ and $R_4$ are bonded, a $C_{3-6}$ ring, and n, m and p are independently an integer of 0 to 3, with the proviso that when $X_1$ is a group of Formula (2), Formula (3) or Formula (4-1), $0 \leq n+m \leq 5$ is satisfied, and when $X_1$ is a group of Formula (4), $0 \leq n+m+p \leq 8$ is satisfied]; and a solvent.

2. The resist underlayer film according to claim 1, wherein the polymer further contains, besides the partial structure of Formula (1), a partial structure of Formula (5):

Formula (5)

(where $R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group, a and b are independently an integer of 0, 1 or 2, with the proviso that a+b is an integer of 0, 1 or 2), and/or a partial structure of Formula (6):

Formula (6)

(where $R_4$ is a $C_{1-10}$ alkyl group,

Y is a $C_{1-6}$ alkylene group, and c is an integer of 0 or 1).

3. The resist underlayer film according to claim 2, wherein the polymer is produced by hydrolyzing and condensing an organic silicon compound of Formula (1') and an organic silicon compound of Formula (5'):

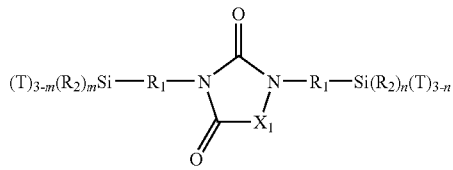

Formula (1')

Formula (5')

(where $R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group, T is a $C_{1-10}$ alkoxy group, an acyloxy group or a halogen group, and a and b are independently an integer of 0, 1 or 2, with the proviso that a+b is an integer of 0, 1 or 2), and/or an organic silicon compound of Formula (6'):

Formula (6')

(where $R_4$ is a $C_{1-10}$ alkyl group,

Y is a $C_{1-6}$ alkylene group,

T is a $C_{1-10}$ alkoxy group, an acyloxy group or a halogen group, and c is an integer of 0 or 1).

4. The resist underlayer film according to claim 1, wherein the polymer further contains, besides the partial structure of Formula (1), a partial structure of Formula (5):

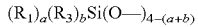 Formula (5)

where $R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group, or a cyano group, a and b are independently an integer of 0, 1, or 2, with the proviso that a+b is an integer of 0, 1, or 2.

5. The resist underlayer film according to claim 4, wherein the polymer is produced by hydrolyzing and condensing an organic silicon compound of Formula (1') and an organic silicon compound of Formula (5'):

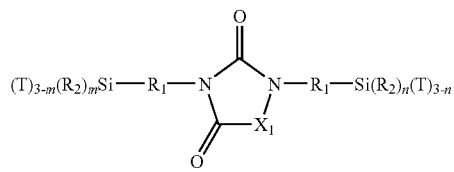 Formula (1')

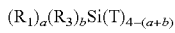 Formula (5')

(where $R_1$ and $R_3$ are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group, T is a $C_{1-10}$ alkoxy group, an acyloxy group or a halogen group, and a and b are independently an integer of 0, 1 or 2, with the proviso that a+b is an integer of 0, 1 or 2.

6. The resist underlayer film according to claim 1, wherein the polymer is produced by hydrolyzing and condensing an organic silicon compound of Formula (1'):

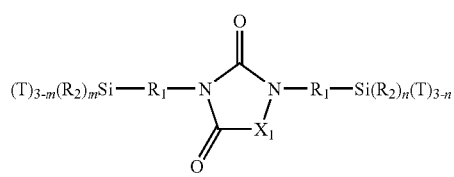 Formula (1')

(where $X_1$ is a group of Formula (2'), Formula (3'), Formula (4') or Formula (4'-1):

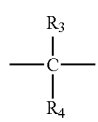 Formula (2')

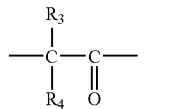 Formula (3')

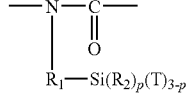 Formula (4')

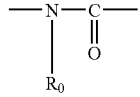 Formula (4'-1)

$R_0$ is a hydrogen atom, an alkyl group, an aryl group or an alkenyl group, $R_1$s are independently a divalent organic group, $R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group, O— is an oxygen-containing group of atoms bonded to a silicon atom through a Si—O bond, $R_3$ and $R_4$ are independently a hydrogen atom, a $C_{1-10}$ alkyl group, a $C_{3-6}$ alkenyl group, a benzyl group or a phenyl group (where, the phenyl group is optionally substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or $R_3$ and $R_4$ form together with a carbon atom to which $R_3$ and $R_4$ are bonded, a $C_{3-6}$ ring, T is a $C_{1-10}$ alkoxy group, an acyloxy group or a halogen group, and n, m, and p are independently an integer of 0 to 3, with the proviso that when $X_1$ is a group of Formula (2'), Formula (3') or Formula (4'-1), $0 \leq n+m \leq 5$ is satisfied, and when $X_1$ is a group of Formula (4'), $0 \leq n+m+p \leq 8$ is satisfied).

7. The resist underlayer film according to claim 1, wherein the composition further comprises a crosslinking catalyst.

8. The resist underlayer film of claim 1, wherein the film is obtained by baking the resist underlayer film forming composition.

9. A production method of a semiconductor device comprising:

applying on a semiconductor substrate a resist underlayer film forming composition that comprises a polymer containing a partial structure of Formula (1):

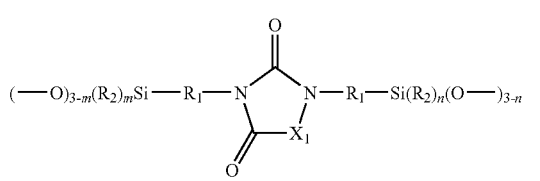 Formula (1)

where $X_1$ is a group of Formula (2), Formula (3), Formula (4) or Formula (4-1):

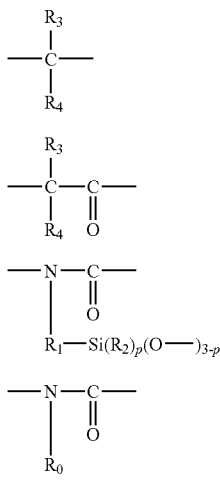

Formula (2)

Formula (3)

Formula (4)

Formula (4-1)

$R_0$ is a hydrogen atom, an alkyl group, an aryl group or an alkenyl group, $R_1$s are independently a divalent organic group, $R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group.

O— is an oxygen-containing group of atoms bonded to a silicon atom through a Si—O bond, $R_3$ and $R_4$ are independently a hydrogen atom, a $C_{1-10}$ alkyl group, a $C_{3-6}$ alkenyl group, a benzyl group or a phenyl group (where, the phenyl group is optionally substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or $R_3$ and $R_4$ form together with a carbon atom to which $R_3$ and $R_4$ are bonded, a $C_{3-6}$ ring, and n, m and p are independently an integer of 0 to 3, with the proviso that when $X_1$ is a group of Formula (2), Formula (3) or Formula (4-1), $0 \leq n+m \leq 5$ is satisfied, and when $X_1$ is a group of Formula (4), $0 \leq n+m+p \leq 8$ is satisfied]; and a solvent baking the resist underlayer film forming composition to form a resist underlayer film;

applying a composition for a resist on the underlayer film to form a resist film;

subjecting the resist film to exposure;

developing the resist after the exposure to produce a resist pattern;

etching the resist underlayer film using the resist pattern; and processing the semiconductor substrate using the patterned resist and the patterned resist underlayer film.

10. A production method of a semiconductor device comprising:

forming an organic film on a semiconductor substrate using an application-type organic film forming composition;

applying on the organic film a resist underlayer film forming composition that comprises a polymer containing a partial structure of Formula (1):

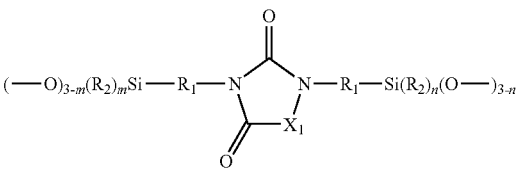

Formula (1)

[where $X_1$ is a group of Formula (2), Formula (3), Formula (4) or Formula (4-1):

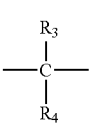

Formula (2)

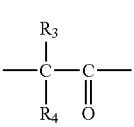

Formula (3)

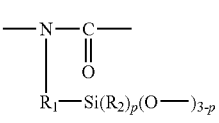

Formula (4)

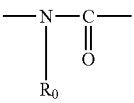

Formula (4-1)

$R_0$ is a hydrogen atom, an alkyl group, an aryl group or an alkenyl group, $R_1$s are independently a divalent organic group, $R_2$s are independently an organic group bonded to a silicon atom through a Si—C bond and having an alkyl group, an aryl group, a halogenated alkyl group, a halogenated aryl group, an alkenyl group, an epoxy group, an acryloyl group, a methacryloyl group, a mercapto group, an amino group or a cyano group, O— is an oxygen-containing group of atoms bonded to a silicon atom through a Si—O bond, $R_3$ and $R_4$ are independently a hydrogen atom, a $C_{1-10}$ alkyl group, a $C_{3-6}$ alkenyl group, a benzyl group or a phenyl group (where, the phenyl group is optionally substituted with a group selected from a group consisting of a $C_{1-10}$ alkyl group, a halogen atom, a $C_{1-10}$ alkoxy group, a nitro group, a cyano group, a hydroxy group and a $C_{1-10}$ alkylthio group), or $R_3$ and $R_4$ form together with a carbon atom to which $R_3$ and $R_4$ are bonded, a $C_{3-6}$ ring, and n, m and p are independently an integer of 0 to 3, with the proviso that when $X_1$ is a group of Formula (2), Formula (3) or Formula (4-1), $0 \leq n+m \leq 5$ is satisfied, and when $X_1$ is a group of Formula (4), $0 \leq n+m+p \leq 8$ is satisfied]; and a solvent baking the resist underlayer film forming composition to form a resist underlayer film;

applying a composition for a resist on the resist underlayer film to form a resist film;
subjecting the resist film to exposure;
developing the resist after the exposure to produce a resist pattern;
etching the resist underlayer film using the resist pattern;
etching the organic underlayer film using the patterned resist underlayer film; and
processing the semiconductor substrate using the patterned organic film.

* * * * *